(12) United States Patent
Kuyel

(10) Patent No.: US 10,366,898 B2
(45) Date of Patent: Jul. 30, 2019

(54) TECHNIQUES AND SYSTEMS FOR CONTINUOUS-FLOW PLASMA ENHANCED ATOMIC LAYER DEPOSITION (PEALD)

(71) Applicant: Nano-Master, Inc., Austin, TX (US)

(72) Inventor: Birol Kuyel, Austin, TX (US)

(73) Assignee: Nano-Master, Inc., Austin, TX (US)

(\*) Notice: Subject to any disclaimer, the term of this patent is extended or adjusted under 35 U.S.C. 154(b) by 0 days.

(21) Appl. No.: 15/950,330

(22) Filed: Apr. 11, 2018

(65) Prior Publication Data

US 2018/0269066 A1 Sep. 20, 2018

Related U.S. Application Data

(62) Division of application No. 15/458,642, filed on Mar. 14, 2017, now Pat. No. 9,972,501.

(51) Int. Cl.
| | |
|---|---|
| *C23C 16/30* | (2006.01) |
| *C23C 16/40* | (2006.01) |
| *C23C 16/44* | (2006.01) |
| *C23C 16/50* | (2006.01) |
| *H01J 37/32* | (2006.01) |

(Continued)

(52) U.S. Cl.
CPC ...... *H01L 21/28562* (2013.01); *C23C 16/303* (2013.01); *C23C 16/40* (2013.01); *C23C 16/403* (2013.01); *C23C 16/4412* (2013.01); *C23C 16/45527* (2013.01); *C23C 16/45538* (2013.01); *C23C 16/45544* (2013.01); *C23C 16/50* (2013.01); *H01J 37/321* (2013.01);

(Continued)

(58) Field of Classification Search
CPC ............ H01L 21/0228; H01L 21/3141; C23C 16/4554; C23C 16/45551
See application file for complete search history.

(56) References Cited

U.S. PATENT DOCUMENTS

| | | |
|---|---|---|
| 4,282,267 A | 8/1981 | Kuyel |
| 5,332,442 A | 7/1994 | Kubodera et al. |

(Continued)

OTHER PUBLICATIONS

Beneq, "Advanced tool for advanced ALD research: Thin Film System—TFS 200", Beneq, Jul. 1, 2009, 28 pgs.

(Continued)

*Primary Examiner* — Stephen M Bradley
(74) *Attorney, Agent, or Firm* — ASIF GHIAS

(57) ABSTRACT

Techniques are disclosed for methods and apparatuses for performing continuous-flow plasma enhanced atomic layer deposition (PEALD). Plasma gas, containing one or more component gases, is continuously flowed to a planar inductive coupled plasma source attached at an upper end of a cylindrical chamber. Plasma is separated from the ALD volume surrounding a wafer/substrate in the lower end of the chamber by a combination of a grounded metal plate and a ceramic plate. Each plate has a number of mutually aligned holes. The ceramic plate has holes with a diameter less than 2 Debye lengths and has a large aspect ratio. This prevents damaging plasma flux from entering the ALD volume into which a gaseous metal precursor is also pulsed. The self-limiting ALD reaction involving the heated substrate, the excited neutrals from the plasma gas, and the metal precursor produce an ultra-uniform, high quality film on the wafer. A batch configuration to simultaneously coat multiple wafers is also disclosed.

8 Claims, 15 Drawing Sheets

(51) Int. Cl.
*C23C 16/455* (2006.01)
*H01L 21/285* (2006.01)

(52) U.S. Cl.
CPC .. *H01J 37/32449* (2013.01); *H01J 37/32715* (2013.01); *H01J 37/32724* (2013.01)

(56) References Cited

U.S. PATENT DOCUMENTS

| | | | |
|---|---|---|---|
| 6,863,021 B2 | 5/2005 | Sneh | |
| 6,916,398 B2 | 7/2005 | Chen et al. | |
| 6,998,014 B2 | 2/2006 | Chen et al. | |
| 7,138,336 B2 | 11/2006 | Lee et al. | |
| 7,314,835 B2 | 1/2008 | Ishizaka et al. | |
| 7,341,959 B2 | 3/2008 | Brcka | |
| 7,780,785 B2 | 8/2010 | Chen et al. | |
| 7,966,969 B2 | 6/2011 | Hasper et al. | |
| 8,187,679 B2 | 5/2012 | Dickey et al. | |
| 8,637,411 B2 * | 1/2014 | Swaminathan | C23C 16/045 438/763 |
| 8,728,955 B2 | 5/2014 | LaVoie et al. | |
| 8,940,646 B1 | 1/2015 | Chandrasekharan et al. | |
| 9,343,296 B2 | 5/2016 | LaVoie | |
| 2002/0129769 A1 * | 9/2002 | Kim | C23C 16/45514 118/723 E |
| 2008/0110400 A1 * | 5/2008 | Satou | H01J 37/3244 118/723 VE |
| 2011/0003087 A1 | 1/2011 | Soininen et al. | |
| 2012/0141676 A1 | 6/2012 | Sershen et al. | |
| 2012/0269968 A1 * | 10/2012 | Rayner, Jr. | C23C 16/452 427/255.26 |
| 2013/0251916 A1 * | 9/2013 | Krueger | C23C 16/045 427/569 |
| 2014/0216337 A1 | 8/2014 | Swaminathan et al. | |
| 2014/0366804 A1 | 12/2014 | Pak et al. | |
| 2015/0167167 A1 | 6/2015 | Vermeer et al. | |
| 2015/0376785 A1 | 12/2015 | Knaapen et al. | |
| 2016/0052655 A1 | 2/2016 | Nguyen et al. | |
| 2016/0312360 A1 * | 10/2016 | Rasheed | C23C 16/45544 |
| 2017/0002463 A1 * | 1/2017 | Fan | C23C 16/45525 |
| 2017/0016114 A1 | 1/2017 | Becker et al. | |

OTHER PUBLICATIONS

Hossbach, C. et al., "Overview of ALD equipment and technologies", ALD for Industry 2017, EFDS Workshop, Institute of Semiconductors and Microsystems—Technical University of Dresden, Jan. 17, 2017, 47 pgs.

Kaariainen, Tommi O. et al., "Plasma-Assisted Atomic Layer Deposition of Al2O3 at Room Temperature", Plasma Processes and Polymers, Wiley Inter-Science, Jun. 2009, pp. 237-241.

Standing, A.J., "Nanowire solar water splitting", Technische Universiteit Eindhoven, Thesis—Applied Physics, Jan. 6, 2016, 170 pgs.

* cited by examiner

TECHNIQUES AND SYSTEMS FOR
CONTINUOUS-FLOW PLASMA ENHANCED
ATOMIC LAYER DEPOSITION (PEALD)

CROSS-REFERENCE TO RELATED
APPLICATIONS

This application is a divisional of and claims priority from now allowed U.S. patent application Ser. No. 15/458,642 filed on Mar. 14, 2017 and which is incorporated by reference herein in its entirety. This application is also related to and being co-filed on the same day as another U.S. patent application entitled "Techniques and systems for continuous-flow plasma enhanced atomic layer deposition (PEALD)" by present inventor Birol Kuyel, and which application is also incorporated by reference herein in its entirety.

FIELD OF THE INVENTION

This invention relates generally to atomic layer deposition (ALD) and more specifically to continuous-flow ALD for depositing ultra-uniform atomically sized films/layers on a substrate.

BACKGROUND ART

Atomic layer deposition (ALD) is a special type of chemical vapor deposition (CVD) technique. ALD utilizes a sequential exposure of gaseous reactants for the deposition of atomically sized thin films. The reactants are often metal precursors consisting of organometallic liquids or solids used in the chemistry by vaporizing under vacuum and/or heat conditions. The reactants are introduced as a series of sequential, non-overlapping pulses. In each of these pulses, the reactant molecules react with a substrate or wafer surface in a self-limiting way. Consequently, the reaction ceases once all the reactive sites on the wafer/substrate surface are consumed. Between the two pulses, a purge step is applied to remove the excess reactants and byproducts from the process chamber. Using ALD, it is possible to grow materials uniformly and with high precision on arbitrarily complex and large substrates. Some examples of films produced using ALD are $SiO_2$, $Si_3N_4$, $Ga_2O_3$, $GaN$, $Al_2O_3$, $AlN$, etc.

The timing diagram of a typical prior art system is shown in FIG. 1. FIG. 1 shows two series of alternating pulses PA and PB of two reactants A and B. The two pulses correspond to time periods $T_A$ and $T_B$ respectively, which includes a dosing time and any additional wait/purge time required to pump out excess reactant and/or reaction products. This additional wait/purge time for reactants A and B is indicated by $w_A$ and $w_B$ in FIG. 1. Therefore, the corresponding dosing times for reactants A and B are $T_A$-$w_A$ and $T_B$-$w_B$ respectively.

The cycle-time of such a prior art system is equal to $T_A$+$T_B$ as shown in FIG. 1, consisting of a dose-purge-dose-purge sequence. The cycle is repeated as many times as needed to obtain a film of the desired thickness as required for a given application or recipe. In a plasma enhanced/assisted ALD (PEALD/PAALD) system, a plasma is used for reactant activation in order to trigger the self-limiting reaction on the heated substrate. In contrast, in a thermal ALD system, high temperature is used for facilitating the reaction.

There are many different techniques for performing ALD in the prior art. U.S. Pat. No. 7,314,835 to Ishizaka, discloses a method for depositing a film on a substrate using a plasma enhanced atomic layer deposition (PEALD) process. The method includes disposing the substrate in a process chamber configured to facilitate the PEALD process. A first process material is introduced within the process chamber, and a second process material is introduced within the process. Radio Frequency (RF) power of more than 600 Watts (W) is coupled to the process chamber during the introduction of the second process material. This results in the generation of a plasma that accelerates a reduction reaction between the first and second process materials at a surface of the substrate. The film is formed on the substrate by alternatingly introducing the first process material and the second process material.

U.S. Pat. No. 7,341,959 to Brcka also discloses a method for depositing a film on a substrate using a plasma enhanced atomic layer deposition (PEALD) process. The method includes disposing the substrate in a process chamber configured to facilitate the PEALD process. The process chamber includes a substrate zone proximate to the substrate and a peripheral zone proximate to a peripheral edge of the substrate. The method also includes introducing a first process material and a second process material within the process chamber and coupling RF power to the process chamber during the introduction of the second process material. This results in the generation of a plasma that facilitates a reduction reaction between the first and the second process materials at a surface of the substrate.

Furthermore, RF power is coupled to a process electrode to generate a substrate zone plasma in the substrate zone that ionizes contaminants substantially in a region of the substrate. RF power to a peripheral electrode generates a peripheral zone plasma in the peripheral zone having a characteristic different from the substrate zone plasma. As a result, the ionized contaminants are transported from the substrate zone to the peripheral zone in the process chamber.

U.S. Patent Publication No. 2017/0016114 A1 to Becker discloses a gas deposition chamber. The chamber includes a volume expanding top portion and a substantially constant volume cylindrical middle portion and optionally a volume reducing lower portion. An aerodynamically shaped substrate support chuck is disposed inside the gas deposition chamber with a substrate support surface positioned in the cylindrical middle portion. The top portion reduces gas flow velocity. The aerodynamic shape of the substrate support chuck reduces drag and promotes laminar flow over the substrate support surface. The lower portion increases gas flow velocity after the substrate support surface. The gas deposition chamber is configurable to 200 millimeter diameter semiconductor wafers using ALD and or PEALD cooling cycles. A coating method includes expanding process gases inside the deposition chamber prior to the process gas reaching a substrate surface. The method further includes compressing the process gases inside the deposition chamber after the process gas has flowed passed the substrate being coated.

U.S. Patent Publication No. 2012/0141676 A1 to Sershen teaches an ALD coating system. The system includes a fixed gas manifold disposed over a moving substrate with a coating surface of the substrate facing precursor orifice plate. A gas control system delivers gas or vapor precursors and inert gas into the fixed gas manifold which directs input gases onto a coating surface of the moving substrate. The gas control system includes a blower interfaced with the gas manifold which draws gas through the gas manifold to remove unused precursors. Also removed are inert gas and any reaction byproduct from the coating surface. The gas manifold is configured to segregate precursor gases at the coating surface to prevent the mixing of dissimilar precursors. The gas manifold may also segregate unused precursor gases in the exhaust system so that the unused precursors can be recovered and reused.

U.S. Pat. No. 8,940,646 to Chandrasekharan discloses methods of depositing layers of material on multiple semiconductor substrates at multiple processing stations within one or more reaction chambers. The methods include dosing a first substrate with film precursor at a first processing station and dosing a second substrate with film precursor at a second processing station. This is done with precursor flowing from a common source such that the timing of the dosing is staggered. In other words, the first substrate is dosed during a first dosing phase during which the second substrate is not substantially dosed, and the second substrate is dosed during a second dosing phase during which the first substrate is not substantially dosed. Also disclosed are apparatuses having multiple processing stations contained within one or more reaction chambers. Further disclosed is a controller with machine readable instructions for staggering the dosing of first and second substrates at first and second processing stations.

U.S. Pat. No. 9,343,296 to LaVoie discloses methods of forming SiC/SiCN film layers on surfaces of semiconductor substrates. The methods include introducing a silicon-containing film-precursor and an organometallic ligand transfer reagent into a processing chamber. This results in adsorbing the silicon-containing film-precursor, the organometallic ligand transfer reagent, or both onto a surface of a semiconductor substrate such that either or both form an adsorption-limited layer. The methods also include reacting the silicon-containing film-precursor with the organometallic ligand transfer reagent, after either or both have formed the adsorption-limited layer. The reaction results in the forming of the film layer. In other variations, a byproduct is also formed which contains substantially all of the metal of the organometallic ligand transfer reagent. The methods include removal of the byproduct from the processing chamber. Also disclosed are corresponding semiconductor processing apparatuses for forming SiC/SiCN film layers.

U.S. Patent Publication No. 2011/0003087 A1 to Soininen discloses a reaction chamber of a reactor for coating or treating a substrate by an ALD process. This is accomplished by exposing the substrate to alternately repeated surface reactions of two or more gas-phase reactants. The reaction chamber is configured to generate capacitively coupled plasma and comprises a reaction space within the reaction chamber. It also comprises a first inlet to guide gases into the chamber and an outlet to lead gases out of the chamber. The reaction chamber is configured to lead the two or more reactants into the reaction chamber. This is done such that the two or more reactants may flow through the reaction space across the substrate in a direction essentially parallel to the inner surface of the lower wall.

Non-Patent Literature (NPL) reference of "Plasma-Assisted Atomic Layer Deposition Al2O3 at Room Temperature" by Tommi O. Kaariainen dated 2009 teaches a design of plasma source used for PEALD of Al2O3 films at room temperature. In their reactor, the plasma is generated by capacitive coupling and directly in the deposition chamber adjacent to the substrate. However, it can be separated from it by a grid to reduce the ion bombardment while maintaining the flow of radicals directly to the substrate surface.

During the ALD cycle, a mixture of nitrogen and argon is introduced into the reactor to act as a purge gas between precursor pulses and to facilitate the generation of a plasma during the plasma cycle. Sequential exposures of TriMethylAluminum (TMA) and excited O2 precursors are used to deposit Al2O3 films on Si(100) substrates. A plasma discharge is activated during the oxygen gas pulse to form radicals in the reactor space. The experiments show that the growth rate of the film increased with increasing plasma power and with increasing O2 pulse length before saturating at higher power and longer O2 pulse length. Their growth rate saturated at the level of 1.78 Angstrom (Å) per cycle.

U.S. Pat. No. 4,282,67 to Kuyel teaches a method and system for generating plasma using an RF-excited radial-flow, cylindrical plasma rector. The reactor includes a toroidal waveguide of rectangular cross-section connected to a microwave source. One of the reactive species of the plasma is flowed through the waveguide and is pre-ionized. The design permits independent control over the activation of both reactive species.

It is believed that widespread adoption of ALD technology for a variety of promising industrial applications is predicated upon obtaining a film thickness that is extremely uniform across the substrate and has very little or no hydrogen content. It is also important to reduce the cycle-time for the production of the film so that operational throughput can be increased. Such an increased throughput would result in reduced costs and other economies of scale. Furthermore, in traditional ALD systems, Ammonia (NH3) is used for nitridation. NH3, being a corrosive chemical, incurs a high downstream cost of abatement as known by those skilled in the art.

The prior art cited above fails to accomplish these goals. More specifically, the prior art is ineffective at producing extremely uniform films across the substrate surface with short cycle-times. That is because the high energy plasma flux is able to enter from the plasma chamber of typical prior art designs into the ALD volume around the substrate. Such prior art designs may use a showerhead (Chandrasekharan, LaVoie, Soininen) or a grid (Kaariainen) to separate the plasma from the substrate. The plasma is also sometimes pulsed to minimize exposure to the substrate or to reduce the energy of the plasma ions/flux.

In any case, the result is that high energy plasma flux still manages to enter the ALD volume and gets into contact with the substrate. This results in the damaging of the substrate surface and deterioration of the deposited film quality. Furthermore, the cycle-times in typical designs cannot be significantly reduced. As a result, the prior art is unable to satisfy the very high quality and uniformity, low cost and high throughput requirements of many industrial applications.

OBJECTS OF THE INVENTION

In view of the shortcomings of the prior art, it is an object of the present invention to provide methods and apparatuses/systems for performing ALD with high quality/uniformity of films, fast cycle-times and low cost of operation.

It is another object of the invention to produce such high quality/uniformity films by preventing the flow of damaging plasma flux from entering into the ALD volume.

It is still another object of the invention to significantly reduce the ALD cycle-times as compared to traditional ALD systems.

It is yet another object of the invention to have a continuous-flow of plasma gases into the chamber throughout the deposition process.

Still other objects and advantages of the invention will become apparent upon reading the detailed description in conjunction with the drawing figures.

SUMMARY OF THE INVENTION

The objects and advantages of the invention are secured by methods of systems for performing continuous-flow atomic layer deposition (ALD). Although the present teachings support both plasma enhanced ALD (PEALD) as well as thermal ALD processes, special attention is paid to PEALD. This is because of the remarkably uniform films with little or no hydrogen content produced by PEALD. Furthermore, instant PEALD techniques do not require ammonia (NH3) for nitridation, so expensive downstream ammonia abatement activities are also avoided.

In the instant design, PEALD is carried out inside a chamber, at the one end of which a substrate/wafer is placed above a platen which is heated by a platen heater. Preferably, the platen heater heats the platen and the substrate by resistive heating. The platen heater thus heats the substrate to a desired temperature. At the other end of the chamber is affixed a preferably planar, inductively coupled plasma (ICP) source. Gas A or plasma gas is supplied to the planar ICP source by gas lines at two laterally opposite gas feedthrough points from above the ICP source. In a distinguishing aspect of the technology, the plasma gas is continually/continuously flowed to the ICP source throughout the deposition process.

Consequently, the plasma from the plasma gas or gas A is also continuously generated in the instant continuous-flow PEALD design. The plasma is generated below a quartz plate of the ICP source in the chamber. In another innovative aspect, the plasma is isolated from the substrate by a combination of a grounded metal plate and a ceramic plate affixed in the chamber between the ICP source and the substrate. The grounded metal plate and the ceramic plate have a number of holes, such that each hole of one plate is perfectly aligned with a corresponding hole of the other plate.

The diameter of the holes in the metal plate is preferably ⅛ inches. However, the number of holes is far lesser than a typical dense showerhead design of the traditional art. In comparison, the corresponding holes of the ceramic plate are much smaller, preferably less than two Debye lengths of the plasma. The plasma field is shorted by the grounded metal plate. But the excited radicals, terminated by the metal plate, pass through its holes as neutral atoms/molecules.

The excited neutrals then pass through the small ceramic plate holes to reach the ALD volume around the substrate. In yet another distinguishing aspect, the high energy plasma flux consisting of plasma ions and electrons is prevented from entering the ALD volume by the ceramic plate while only the excited neutrals pass through. This is only possible because of the above mentioned design of the ceramic plate holes having diameter less than two Debye lengths.

The excited/activated neutrals thus reaching the ALD volume are always present around the substrate, in contrast to the typical ALD systems where only one reactant is present in the ALD volume at a given time. A pulse of a gas B is also passed into the ALD volume, preferably from below the substrate. Preferably, gas B is a metal precursor on a carrier gas. In the ALD volume, the excited neutrals, the metal precursor and the heated substrate react in a self-limiting manner. In a surprising aspect of the design, a layer of atomically sized film is produced even with the continuous presence of one of the reactants (the excited neutrals from the plasma). In this manner, remarkably uniform thickness, high quality films can be deposited/coated on the substrate surface.

As many pulses of gas B may be passed in as many ALD cycles as desired to incur a required thickness of the deposited film. In a highly preferred embodiment, the chamber comprises an upper portion and a lower portion that can close to pneumatically seal the chamber. In another embodiment, gas A is a mixture of more than one component gases or chemical species. In yet another embodiment, gas B is also a mixture of component gases or chemical species. One of such component gases in gas B may be a carrier gas that is used to carry a reactant or precursor with insufficient vapor pressure to reach the chamber.

Preferably, gas A comprises one or more of nitrogen, argon, oxygen and hydrogen. Preferably, gas B comprises a metal precursor and the film deposited is that of an oxide or a nitride of a metal. Preferably, the precursor is of a metal such as aluminum (Al), gallium (Ga), silicon (Si), zinc (Zn), hafnium, etc. and carried on an appropriate carrier gas. The carrier gas may be nitrogen (N2) or argon (Ar).

Preferably, the deposited film is one of AlN, Al2O3, GaN, Ga2O3, SiO2, Si3N4, ZnO, Zn3N2, HfO2, etc. Preferably the transit distance that the excited neutrals travel in the chamber towards the substrate is less than 1 centimeter, significantly less than the traditional art. The transit distance is defined as the vertical distance from the upper surface of the metal plate to the imaginary horizontal plane equidistant between the lower surface of the ceramic plate and the top of the substrate. Such a short transit distance is only possible because of the very compact instant design. The system can also operate in pure thermal ALD mode without requiring plasma.

Preferably, gas A is flowed to the planar ICP source substantially vertically with respect to the substrate. In contrast, gas B is preferably flowed substantially horizontally with respect to the substrate. Very advantageously, the cycle-time of the ALD process as result of the instant design is reduced to the duration of time between two consecutive pulses of gas B. This is a significant performance/throughput improvement over the prior art. That is because in traditional art, each reactant is pulsed alternately and the cycle-time is equal to the time duration between two consecutive pluses of a reactant, including an intervening pulse of the other reactant. Also, since gas A is always present in the chamber, no separate purge cycle is needed in the present design.

As many pulses of gas B are sent to the chamber as needed to obtain a film of a desired thickness. More specifically, as many ALD cycles are performed as needed to obtain a film of a desired thickness. During these cycles, one or more of the component gases or chemical species of gas A and/or gas B may be changed during the execution of the recipe. This may be needed if films of different compounds need to be deposited in a single recipe. In such an embodiment, a purge cycle may need to be performed before gas species are altered.

In a highly preferred embodiment, a load-lock mechanism is used to prevent oxidation of the finished/coated substrate. After the film deposition is complete, the load-lock mechanism, working in conjunction with a lift assembly of the platen heater, removes the hot substrate from the chamber. It does so by virtue of an arm and an end effector to bring the hot substrate from the chamber into a pneumatically sealed load-lock compartment containing inert nitrogen (N2). The hot substrate is allowed to cool off in that inert environment before being exposed to environmental oxygen.

A batch version of the present PEALD design is also disclosed. In the instant batch PEALD version, there are a number of substrate modules vertically stacked inside a batch chamber. Each substrate module has a heated substrate at the bottom. The plasma is produced from gas A as before, but by a remote plasma source. Preferably, the remote plasma source is inductive. At or near the remote plasma source is a plasma filter module containing the metal plate with holes and ceramic plate with its holes of the earlier single-wafer embodiments.

Thus, the plasma from the remote plasma source is terminated by the metal plate of the plasma filter module. However, the excited/activated neutrals pass through the metal plate holes and the ceramic plate holes of the plasma filter module. The excited neutrals from the plasma are then fed into the batch chamber using normal tubing traveling up to a distance of preferably half a meter. The excited neutrals are then fed into the ALD volumes of the substrate modules directly above the heated substrates.

Another gas B is also flowed to the batch chamber. As before, gas B typically comprises a gaseous metal precursor on a suitable carrier gas. Gas B is passed through the walls of the batch chamber and preferably delivered directly above the heated substrates in the substrate modules. As in the case of single-wafer embodiments, the excited neutrals of gas A, gas B and the heated substrate react in a self-limiting fashion inside each substrate module. The result is an atomically sized film of a remarkably uniform thickness deposited simultaneously on all the substrates in the batch chamber. As many ALD cycles may be run as desired in order to obtain films of the required thickness.

Clearly, the system and methods of the invention find many advantageous embodiments. The details of the invention, including its preferred embodiments, are presented in the below detailed description with reference to the appended drawing figures.

BRIEF DESCRIPTION OF THE DRAWING FIGURES

DETAILED DESCRIPTION

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable, similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 2:
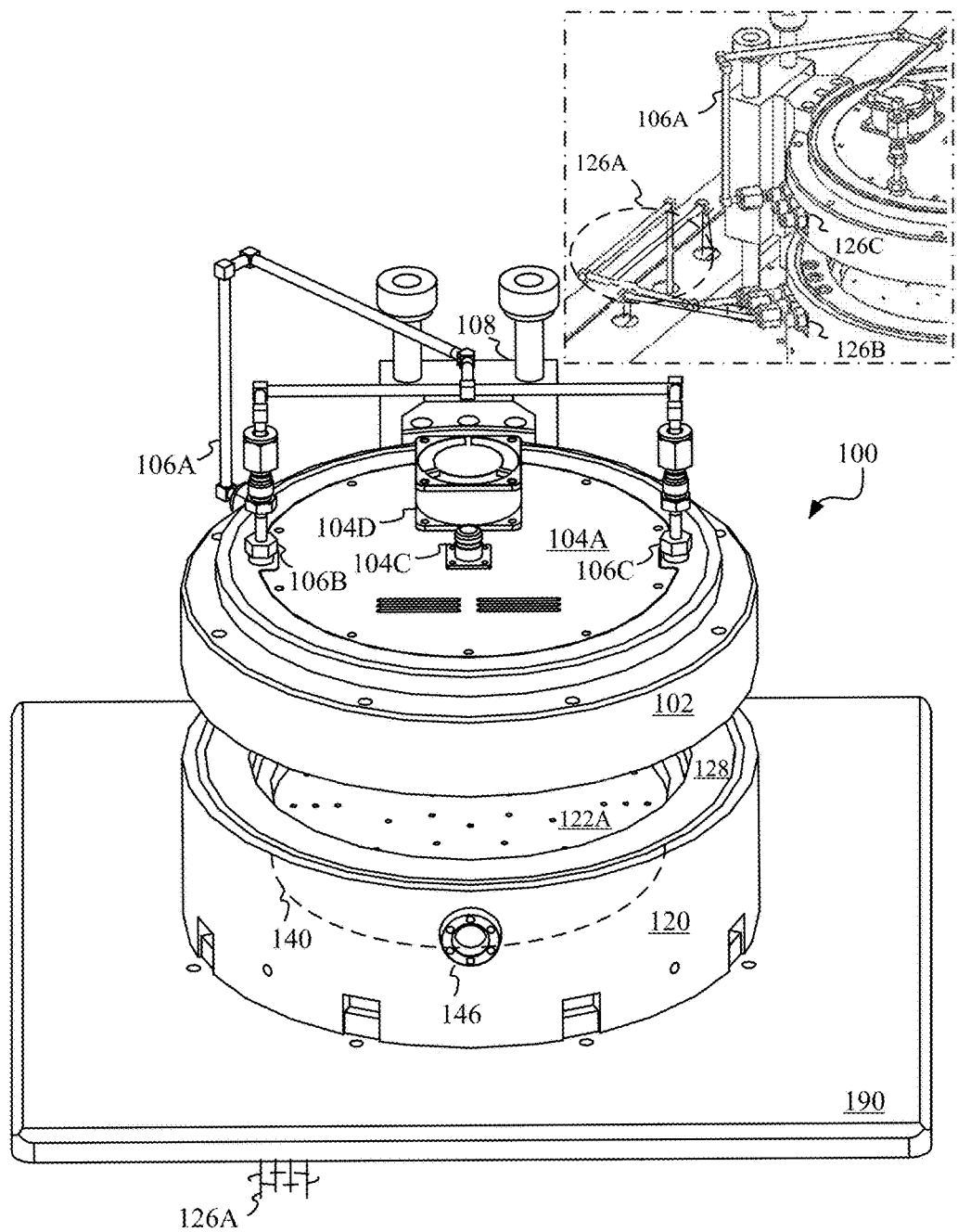
FIG. 2 is a perspective view of the chamber of a continuous-flow plasma enhanced atomic layer deposition (PEALD) system according to this disclosure.

The present invention will be best understood by first reviewing a chamber assembly or simply a chamber 100 of a continuous-flow plasma enhanced atomic layer deposition (PEALD) system according to the present teachings as illustrated in FIG. 2. It will be taught later in this disclosure that the instant principles support both PEALD as well as thermal ALD. However, there are several detailed PEALD embodiments disclosed below. This is because of the remarkably uniform films produced with short cycle-times by the instant PEALD design. Furthermore, the PEALD techniques do not require ammonia (NH3) or hydrazine for nitridation, so the films have little or no hydrogen content while expensive downstream abatement activities are also avoided.

FIG. 2 shows a perspective view of chamber 100. In the preferred embodiment, chamber 100 of the instant continuous-flow PEALD design comprises an upper or top section or portion 102 and a lower or bottom section or portion 120. There is a substrate/wafer surface or a substrate/wafer sample or simply a substrate or a wafer or a sample 140 in lower portion 120 on which deposition or coating of atomically sized layers is performed. Typically, the substrate is a silicon substrate. Sometimes the immediate volume inside chamber 100 surrounding the substrate is also referred to as the ALD volume or the process volume. Substrate 140 is placed on top of a heated platen (not shown) and is indicated in FIG. 2 by a dashed line. This is because it is present on the inside of lower portion 120 below metal plate 122A and a ceramic plate (not shown). Both the platen heater and the ceramic plate will be further discussed in detail below.

There is a planar inductively coupled plasma (ICP) source 104A attached to top portion 102 at its far or distal end from lower portion 120. Planar ICP source 104A has a ducting or tubing or line 106A to carry plasma gas(es) to plasma source 104A at two laterally opposite gas feedthrough points 106B and 106C as shown. According to a distinguishing aspect of the instant technology, a ground or grounded metal plate 122A whose significance will be taught further below, is also affixed or attached to or integrated with chamber 100. In the embodiment shown in FIG. 2 it is affixed in lower/bottom portion 120.

However, in alternative embodiments metal plate 122A may be affixed right in between upper/top portion 102 and lower/bottom portion 120 or in upper/top portion 102. It should be noted that although the below embodiments employ an inductively coupled plasma (ICP) source 104A, the present design may also accommodate a capacitively coupled plasma (CCP) source. Plasma flux from a CCP source may be more energetic. If this more energetic plasma flux were to enter the ALD volume, it would cause pinhole defects on the substrate surface, thus damaging the film uniformity. Furthermore, the increased sputtering around the holes of metal plate 122A from the more energetic plasma may contaminate the deposited film. Henceforth, an ICP source is preferred over a CCP source in the present design. The holes of metal plate 122A will be discussed in much more detail further below.

The preferred embodiment in FIG. 2 also shows a chamber lift 108 and a base plate 190 on which chamber or chamber assembly 100 is mounted. Further shown are ducting/lines 126A required to carry the plasma gas(es) to chamber 100 as will be taught further below. It should be noted that in FIG. 2, top portion 102 and bottom portion 120 of chamber 100 are shown ajar to delineate their components on the inside. Of course, the ALD process is carried out once the two portions are closed together with a snug and airtight fit to seal chamber 100.

Figure 3:
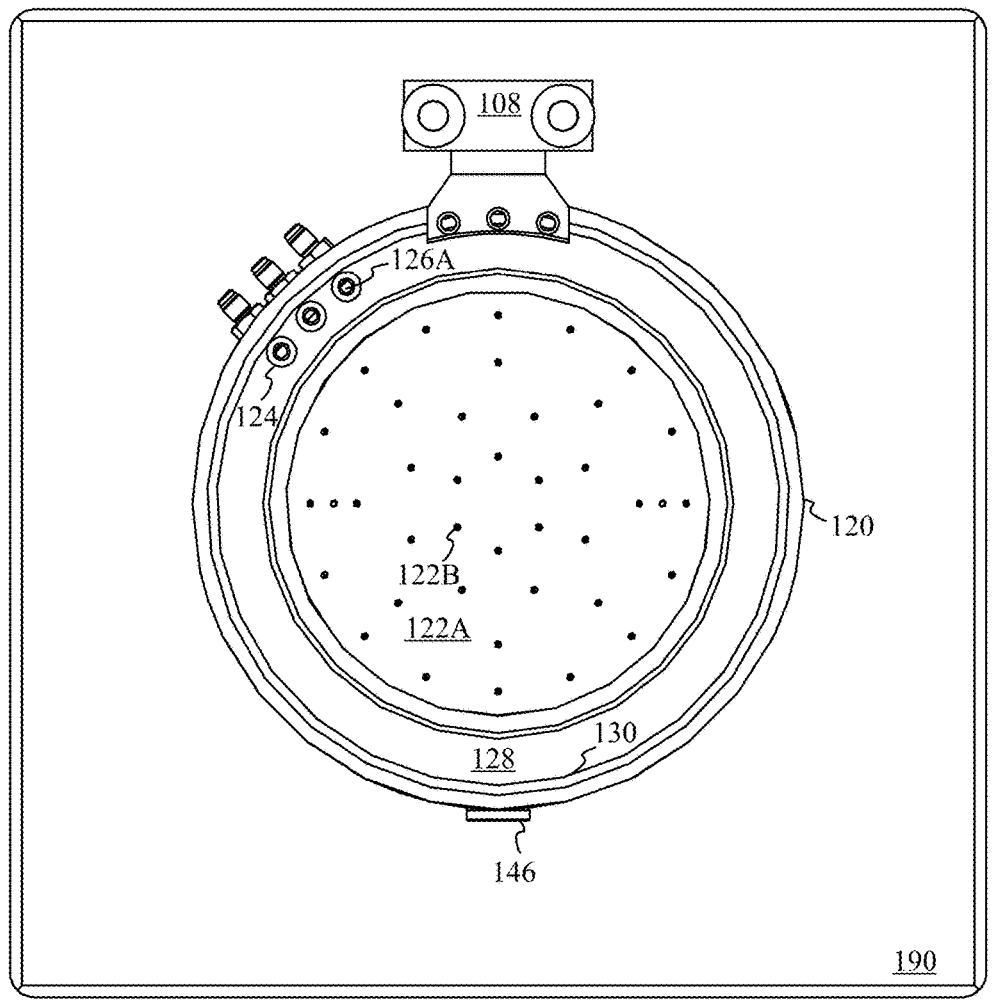
FIG. 3 is a top/plan view of only the bottom portion of the chamber of FIG. 2.

A snug and airtight fit between upper section/portion 102 and lower section/portion 120 is accorded by an O-ring 130 as shown in FIG. 3. FIG. 3 shows in a top/plan view only bottom portion 120 with top portion 102 of chamber 100 removed for illustrative purposes. When top portion 102 (not shown in FIG. 3) is pressed and locked against O-ring 130, an airtight seal between portions 102, 120 is achieved as required to maintain the sealed conditions for the ALD process.

We may refer to the sealed state of chamber 100 as a substantially sealed state in order to represent the range of vacuum conditions required to carry out the operation of the ALD system. The vacuum conditions are preferably obtained by a combination of a backing pump and a turbomolecular pump to be discussed further below. As a result, the system is able to achieve a pressure of about $10^{-6}$ Torr in chamber 100 after 20 minutes of a pump down operation, and a pressure of about $5*10^{-7}$ Torr in a clean, cold system after an overnight pump down operation. Preferably, the operational pressure in chamber 100 ranges from 50 millitorrs to a few hundred millitorrs. As will be discussed that preferably, during the self-limiting ALD reaction, the pressure in the ALD volume around substrate 140 in lower portion 120 is kept at 0.27 Torr or below.

FIG. 3 also shows three smaller O-rings around three stainless steel lines of which only one O-ring and one line are indicated by reference numerals 124 and 126A respectively for clarity. The purpose of O-rings 124 is to seal the flow of gases in ducting/lines 126A. Lines 126A are configured to come from underneath and through base plate 190 (see FIG. 2). They then enter into wall 128 of lower portion 120 at its side at gas ports/feeds 126B shown in the rear perspective view of chamber 100 in the upper right hand corner of FIG. 2. In the rear perspective view of chamber 100 shown in FIG. 2 within dotted-and-dashed lines, only some of the components are marked by reference numerals for clarity of illustration and to avoid clutter. Lines 126A then travel upwards at a right-angle to O-rings 124 through wall 128 of lower portion 120 and into top portion 102 when portions 102, 120 are in a closed position (also see FIG. 3).

Alternatively, lines 126A can come out from underneath baseplate 190 and then directly enter wall 128 of lower portion 120, and then vertically upwards to O-rings 124. In any case, lines 126A surrounded by O-rings 124 at the interface of portions 102, 120 then come outside to the side of upper portion 102 as a single line 106A. Line 106A comes out via ports/feeds 126C shown in the rear perspective view of chamber 100 in FIG. 2. Note that the embodiment of FIG. 2 shows only one such line 106A coming out from upper portion 102. That is because all three lines 126A (also see FIG. 3) entering top portion 102 are allowed to mix together before coming out as a single line 106A.

In other embodiments, one or more of lines 126A may be allowed to enter directly into the inside of upper portion 102 through its internal sidewall and then to planar ICP source 104A without ever coming outside. Still in other embodiments, all three of lines 126A may come out to the side of upper portion 102 as three unmixed individual lines 106A that may feed into ICP source either from the side or from the top at one or more gas feedthroughs. The skilled reader will recognize the many different gas supply configurations available for practicing the instant teachings. As already noted, line 106A eventually feeds into ICP source 104A from the top as two gas feedthroughs 106B, 106C shown in the embodiment of FIG. 2.

The gases flowing via lines 126A from lower portion 120 to upper portion 102 may include reactant gases, plasma gasses, purge gases, or other types of gases as required by a given application or process recipe. As will be taught below, that even though the ALD system being explained can support the use of purge gases, a distinguishing aspect of the present technology is that it does not require a purge cycle. In this disclosure, by the term purge cycle we mean the step in which an inert gas, referred to as a purge gas, is passed through the ALD volume and/or the plasma volume for a length of time. The length of the purge cycle is chosen to cleanse the volume(s) of existing reactants and/or the reaction products. This leads to an overall lengthening of cycle-time and reduction in system throughput.

As will be discussed, that in the present design also, there is a certain wait time after a precursor pulse. During this time, the pressure in the chamber, specifically the ALD volume, decays substantially to the background level. Also during this time, any excess precursor and/or reaction products can be pumped out or purged, before next precursor pulse is sent. However, since plasma gas(es) are always flowing, a complete purge cycle using a purge gas and requiring a pump down and flushing/purging of the plasma chamber is avoided, resulting in significantly shorter cycle-times than traditional systems.

The gases flow through stainless steel gas lines 126A around which O-rings 124 are provided where upper portion 102 and lower portion 120 close together. The above mechanism allows top and bottom portions 102, 120 respectively to separate from each other without requiring flexible tubing to bring gasses to top portion 102. As a result, top chamber 102 can be pneumatically lifted (manually or otherwise) using chamber lift 108 while still allowing gases to flow from bottom portion 120 to top portion 102 when the two portions are in a closed position. As will be appreciated by those skilled in the art, that the use of stainless steel lines of the above design provides for a higher reliability than flexible tubing, and the pneumatic lift design provides for a user friendly system operation.

Figure 4:
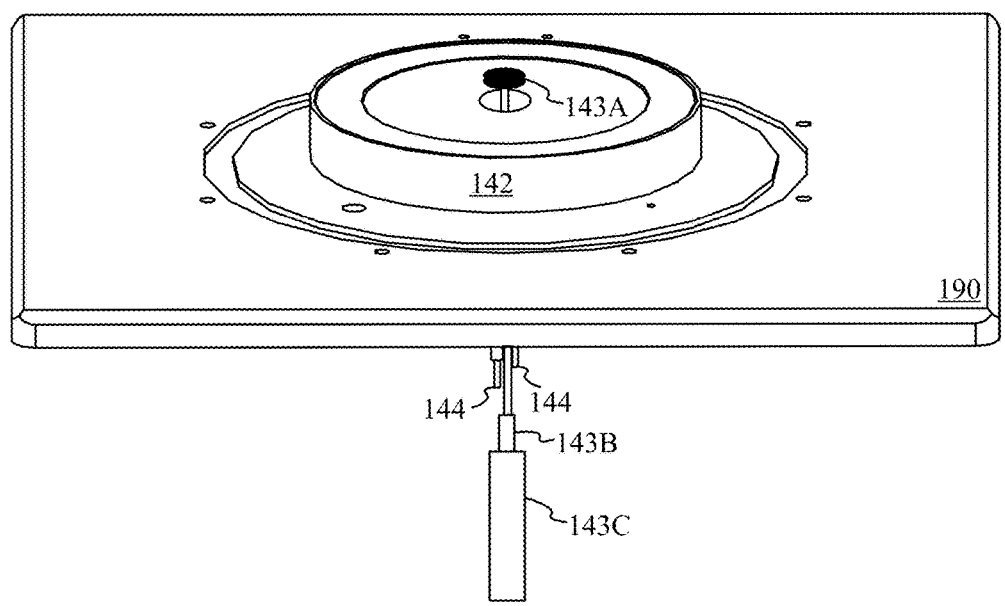
FIG. 4 is a view of the platen heater, its lift assembly and its electrical connections from the embodiments illustrated in FIGS. 2-3.

As already hinted above, chamber 100 also has a heating mechanism for heating substrate surface 140 in bottom portion 120. Specifically, a platen heater 142 as shown in FIG. 4 and constructed out of stainless steel is used for this purpose. Platen heater is a sealed unit that mounts to baseplate 190 through a CF Flange (not shown). Note that sample lift 143A of platen heater lift assembly is shown in FIG. 4 in the raised position. However, lift 143A is normally in its depressed position and below or leveled with its top or working surface on which substrate 140 is placed during the ALD process. Heater 142 is capable of heating substrate 140 (see FIG. 2) to any desired temperature. Preferably, heater 142 can heat substrate 140 up to 500° C. as required to carry out the self-limiting reaction for forming a uniform thickness film as will be taught below.

In the preferred embodiment, heater 142 utilizes resistive heating. It is designed to concentrate and maintain heat uniformly on its upper or working surface on which substrate 140 is placed, while minimizing heat loss at its interface to baseplate 190. Advantageously, the temperature is kept stable via a proportional-integral-derivative (PID) controller, such as one available from OMEGA. FIG. 4 also shows electrical connections 144 underneath baseplate 190 to power heater 142. As a result, platen heater 142 heats its top working surface/platen on which substrate 140 is placed (also see FIG. 2 and associated explanation).

The heating ensues once platen heater 142 is electrically powered or activated. As shown in FIG. 4, platen heater 142 also includes a lift assembly 143A-C used in transferring substrate samples from the load-lock mechanism. The working of lift assembly 143A-C and the lock-lock mechanism will be explained in detail later in this specification. In alternative embodiments, platen heater 142 may utilize inductive heating, Infrared (IR) heating, or other means to heat its top working surface or platen to heat the wafer/substrate. Inductive heating is typically suitable for applications requiring very high temperatures of the substrate, near 1000° C.

In addition, lower portion 120 is also independently heated by one or more cartridge heaters to a temperature below that of substrate 140. The purpose of cartridge heater(s) is to heat the interior walls of lower portion 120 and therefore to avoid condensation on these walls. One with skill in the art will readily understand the use of such cartridge heater(s) and they are not explicitly shown in the drawing figures for clarity.

Figure 6:
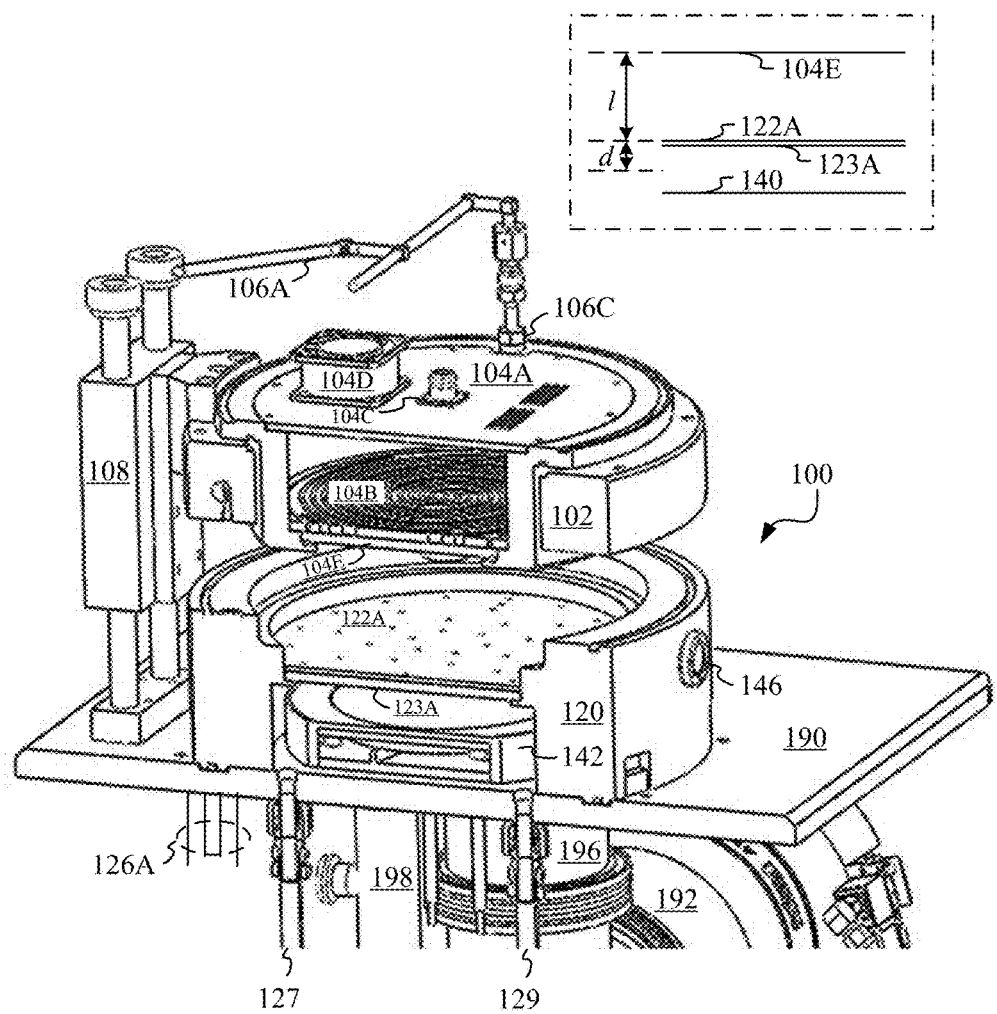
FIG. 6 is a cross-sectional view of the chamber of FIGS. 2-3 along with additional componentry required for an ALD system according to the instant techniques.

Let us now take a look at a cross sectional view of chamber 100 shown in FIG. 6 to further understand its internal components. FIG. 6 shows planar ICP source 104A, its Radio Frequency (RF) inductive antenna/coil 104B and a quartz plate 104E directly below antenna 104B. Sometimes the volume surrounding the plasma in chamber 100 is also referred to as the plasma volume. In the embodiment shown in FIG. 2 and FIG. 6, the plasma volume is contained below quartz plate 104E and above metal plate 122A when upper portion 102 and lower portion 120 are in a closed position.

It should be remarked that quartz plate 104E acts as the sealing component of planar ICP source 104A while its RF coil/antenna stays at atmospheric pressure. An air cooling fan 104D is also provided as shown. In alternative embodiments, a water cooling mechanism can be used to keep the system from overheating. The figure also shows metal plate 122A and ceramic plate 123A underneath metal plate 122A as introduced earlier. Also shown are gas feeding lines 126A, platen heater 142, chamber lift 108, and plasma gas feeding line 106A from earlier teachings.

Further shown in FIG. 6 is a plasma viewport 146. Also shown are separate reactant/precursor feeding lines 127 and 129 towards the frontal part of lower portion 120. Diametrically across the chamber from inputs 127 and 129 is a vacuum port (not shown), which in combination with vacuum pumps discussed below, allows for removal of any unwanted gases from around substrate 140. These may include excess precursor and unwanted reaction byproducts.

FIG. 6 further shows some other componentry of the overall ALD system of the instant technology of which chamber 100 is a part. This preferably includes a turbomolecular pump 192 hinted above, an ALD filter housing 196 and an exhaust pipe 198 driven by a backing pump (not shown) to suction the gases out of chamber 100. Filter housing 196 preferably uses a large area heated filter before turbomolecular pump 192 for depositing unused precursor on a replaceable filter heated with a cartridge heater (not shown). The filter can then be periodically replaced during the operation of the system. It should be remarked that FIG. 6 shows top and bottom portions 102, 120 of chamber 100 in an ajar position to delineate internal components. It is understood that the ALD process taught herein can only commence when these portions are closed/locked to obtain a sealed state of chamber 100 per above teachings.

Referring back to FIG. 3, metal plate 122A has a number of holes 122B. Note that for clarity only one of the holes of metal plate 122A is designated by reference numeral 122B. According to an innovative aspect of the present design, holes 122B are far fewer in number than a typical dense showerhead design available in the art. Without being limited by a specific theory, the reason for this is that the present design does not need uniform plasma flux over a large area for forming its uniform film on substrate 140. Differently put, the gas flow pattern does not affect the film uniformity. ALD process being self-limiting, a single atomic layer can grow laterally until the surface of substrate 140 is covered with one uniform atomic layer.

Figure 5:
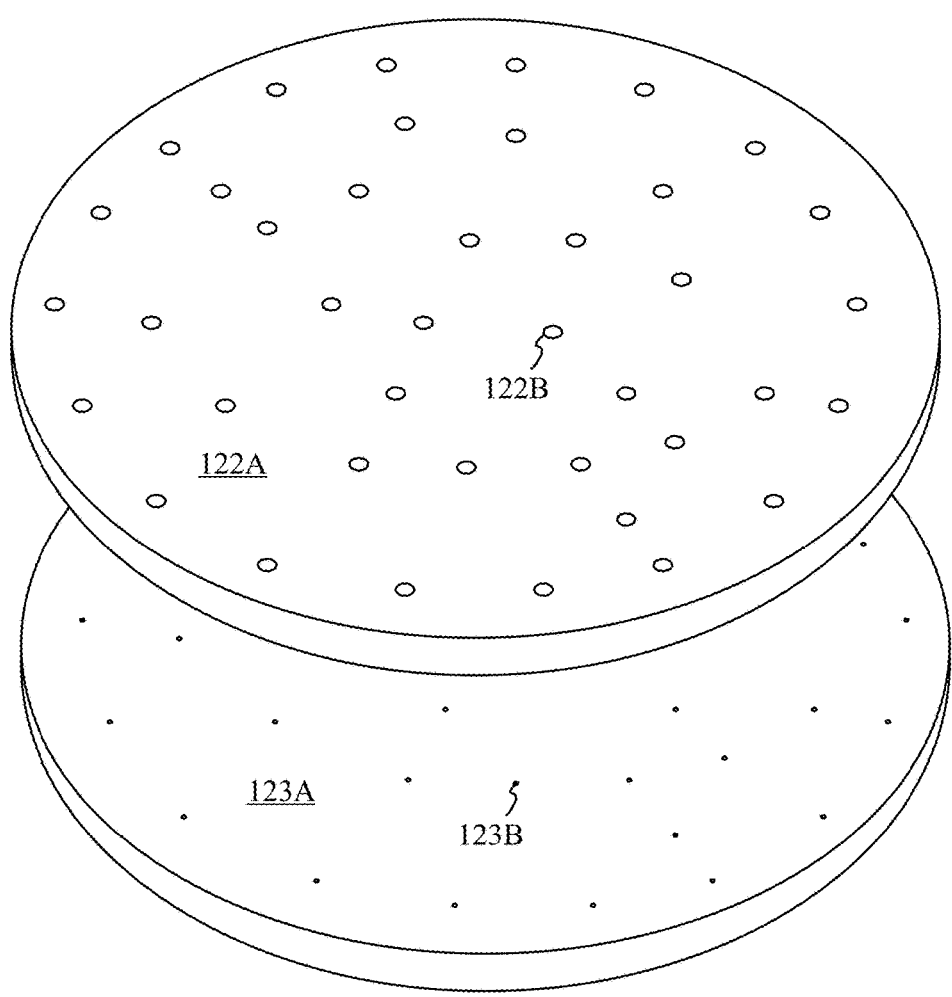
FIG. 5 is an illustration of the instant innovative design of the grounded metal plate with holes, and a ceramic plate with its corresponding holes for preventing the flow of damaging plasma flux into the ALD volume.

Thus, the design can use sparsely distributed holes 122B as compared to traditional art, which in turn allows it to maintain higher pressure in the plasma volume than in the ALD volume. This consequently prevents precursor gas from diffusing to the plasma volume and depositing. Therefore, in the present design, quartz plate 104E does not accumulate deposits in the present design. In a variation, instead of quartz, plate 104E is made of alumina. The advantage of quartz is that one can see the plasma when looking down at ICP source 104A from above. Underneath metal plate 122A is a ceramic metal plate 123A as shown in FIG. 5 and also indicated earlier in the cross-sectional view of chamber 100 in FIG. 6. Referring to FIG. 5, ceramic plate 123A also has holes 123B corresponding to each hole 122B of metal plate 122A.

In another innovative aspect of the instant design, holes 123B of ceramic plate 123A have a diameter less than 2 Debye lengths of the plasma generated in chamber 100. However, holes 122B of metal plate 122A are bigger and of a size more reminiscent of a typical shower head design. Preferably the diameter of metal plate holes 122B is about 0.125 inches. Furthermore, metal plate 122A and ceramic plate 123A of the instant design are attached to chamber 100 in alignment, such that each hole 122B of grounded metal plate 122A is perfectly aligned with its corresponding counterpart hole 123B of ceramic plate 123A.

According to the main aspects of the instant techniques, platen heater 142 is used to heat substrate 140 (see FIG. 2, FIG. 4 and FIG. 6) to a desired temperature required to carry out the above mentioned self-limiting reaction. While chamber 100 is sealed per above teachings, a plasma gas or gas A is flowed/passed/introduced continuously to planar ICP source 104A. We refer to the plasma gas as gas A in order to distinguish it from precursor gas or gas B introduced from below in chamber 100 and to be later explained. Per above explanation of O-rings 124, after having been carried via lines 126A through wall 128 of bottom portion 102 and to top portion 102, gas A is eventually delivered to plasma source 104A via gas feedthroughs 106B-C on a continuous basis (see FIG. 2 and FIG. 6).

In contrast to traditional art, the plasma is continuously produced and present in chamber 100, specifically in the plasma volume, throughout the ALD process. Gas A or the plasma gas may consist of a single chemical specie or it can be a mixture of different chemical/gas species. In the latter case, as already explained above, the gases mix inside lines 126A, 106A before being delivered via laterally opposite gas feedthroughs 106B-C to plasma source 104A as shown in FIG. 2.

Plasma source 104A is preferably powered by a 13.56 Mega Hertz Radio Frequency (RF) generator, such as 1213 W 1 kW RF Generator working with an AIT-600-10 autotuner both available from T&C Power Conversion, Inc. Alternatively, a 600 Watt RF generator with an auto tuner from any other supplier may be used. FIG. 6 also shows an RF input port 104C to which an RF cable (not shown) is connected from the RF power supply (not shown) to ICP source 104A. Also shown is a cooling fan 104D to prevent overheating of the plasma volume, and consequently that of entire chamber 100.

The plasma gas(es) are generally supplied from high pressure reservoir(s) or tank(s) via respective mass flow controllers (MFC) and associated valves. The MFC's may or may not be digital. In the preferred embodiment, the plasma gas or gas A consists of a mixture of nitrogen N2 and argon Ar, or a mixture of oxygen O2 and Ar, or a mixture of hydrogen (H2) and N2. Conveniently, a plasma viewport 146 is also provided in the system as shown in FIGS. 2-3 and FIG. 6 to visually monitor the plasma during system operation as needed.

Because of the presence of grounded metal plate 122A which is at ground potential and at a short distance below quartz plate 104E of ICP source 104A, the plasma is rapidly terminated or shorted or quenched. However, the activated or excited neutrals (radicals terminated by metal plate 122A) of gas A still pass through holes 122B of metal plate 122A and corresponding smaller holes 123B of ceramic plate 123A (see FIGS. 2-3 and FIGS. 5-6). The excited neutrals from the plasma thus enter the ALD volume around substrate 140 in bottom portion 120. The instant design thus results in a rapid quenching or "killing" of the plasma.

The transit distance is defined as the vertical distance from the upper surface of metal plate 122A to the imaginary horizontal plane equidistant between the lower surface of ceramic plate 123A and the top of substrate 140. It is the distance that the neutrals travel when they leave the plasma in the plasma volume to the approximate location where they undergo the ALD reaction in the ALD volume. As compared to traditional systems this transit distance of the instant design is much shorter, and preferably less than 1 centimeter.

Traditional systems require upper plasma volumes of their chambers having lengths of approximately 40 centimeters. In these systems, the plasma volume has to be large to assure the decay of plasma before gas molecules arrive at the substrate. This large plasma volume in traditional systems then has to be pumped down or flushed/purged between cycles resulting in long cycle-times. In contrast, the instant design is much more compact, with the plasma volume having a very short length. Specifically, the length of the plasma volume is the distance between the lower surface of quartz plate 104E and the upper surface of metal plate 122A. This length of the instant plasma volume is preferably approximately of 1 inch. This compact design, combined with the continuous-flow of plasma gas(es) without requiring a purge of the plasma volume, results in substantially lower cycle-times than in traditional art.

For ease of understanding, the transit distance d and the length of the plasma volume 1 of the instant design are illustrated in the dot-and-dashed outlined box in the upper right hand corner of FIG. 6. Note that d and 1 in the above box are not necessarily drawn to scale, and are illustrated for showing their relationships with respect to the rest of the elements of the instant design, namely quartz plate 104E, metal plate 122A, ceramic plate 123A and substrate 140.

Due to the combination of plates 122A, 123A and their holes 122B, 123B respectively, the plasma ions and electrons, sometimes referred to as the ion flux, do not penetrate the small holes 123B of ceramic plate 123A. They thus do not damage substrate 140 as in traditional systems. In order to accomplish this, in yet another innovative aspect, holes 123B of ceramic plate 123A are specifically designed to have a diameter less than 2 Debye lengths. As a result, the plasma flux is prevented from entering the ALD volume to the extent that its damaging effects on the substrate are negligible for most applications.

Referring to FIG. 6, another reactant/reagent referred to as gas B is also introduced into chamber 100, specifically into its bottom portion 120. Gas B is introduced as a pulse into the ALD volume where heated substrate 140 resides. Gas B reactant/reagent is pulsed through gas line 127 from below where substrate is placed above the working surface of platen heater 142.

Preferably, the plasma gas or gas A is flowed to planar ICP source 104A substantially vertically with respect to substrate 140. This is accomplished by feeding gas A to ICP source 104A by vertical gas feedthroughs 106A-B as already explained, and the fact that excited radicals of gas A pass down vertically as neutrals via holes 122B, 123B towards substrate 140 (also see FIG. 2 and FIG. 5). In contrast, gas B is preferably flowed substantially horizontally with respect to substrate 140. This is accomplished by line 127 which feeds gas B from below substrate 140 such that gas B horizontally surrounds the surface of substrate 140.

In other embodiments, reactant/precursor feeding line 127 may be provided from a side, or at another appropriate location in chamber 100, as long as it feeds in below ceramic plate 123A. This is required to keep the precursor gas in the ALD volume where the ALD reaction with the substrate and the excited neutrals from the plasma gas needs to take place. Of course, the ALD reaction can only commence when top and bottom portions 102, 120 are sealed and not in the ajar position shown in FIG. 6 for delineating internal componentry.

Sometimes, the plasma gas or gas A may also be referred to as simply the reactant while gas B may also be referred to as the precursor. This is because gas B is typically used as a metal precursor (on an appropriate carrier gas), that is utilized in the self-limiting ALD reaction for depositing a compound of the metal on the substrate. Thus, while all precursors are reactants, not all reactants are precursors. In this disclosure, we will use the term reactant to generally refer to either gas A or gas B, and will reserve the term precursor for referring to gas B. The applicability of these terms should be apparent from the context to the skilled reader. The deposited compound mentioned above is preferably an oxide or a nitride of the metal. There are several precursors of aluminum, gallium and other metals, such as silicon, zinc and hafnium, available in the art that may utilized for this purpose.

As hinted above, a carrier gas may be used to bring low vapor pressure reagents/reactants/precursors such as liquids/solids into the ALD volume in lower portion 120 (see FIG. 2 and FIG. 6) via line 127. Explained further, the liquid/solid reactant/precursor typically contained in a bottle is first heated by a heater. Then, a carrier gas is used to carry the heated/evaporated reactant from the bottle to the ALD volume. The flow rate of the carrier gas may be adjusted as desired to control the introduction of the reactant.

Another popular method involves using a bubbler mechanism. More specifically, a carrier gas is "bubbled" through the reactant while it is heated. This may be desired for really low vapor pressure reactants. The use of bubblers, heaters, carrier gases, pumps and other such industry standard techniques are well known to skilled artisans, and will not be delved into detail in this specification. Preferably, the carrier gas is nitrogen N2 or argon Ar because of their inert properties well known in the art.

Thus, gas B is pulsed into chamber 100 on a suitable carrier gas using any of the above mentioned or sill other techniques. However, if it is has a high enough vapor pressure then no carrier gas may be necessary to carry it from its reservoir to chamber 100 through line 127. Referring to FIG. 6, once gas B is pulsed into line 127, it comes in contact with the continuously present plasma excited/activated neutrals of gas A in the ALD volume over heated substrate 140.

The two reactant gases (gas B and excited neutrals of gas A) and heated substrate 140 react in a self-limiting manner. Without being limited to a specific theory, the self-limiting reaction may consist of a first self-limiting reaction between the excited neutrals of gas A and heated substrate surface 140. Note that this self-limiting reaction may also be referred to as a surface-limited reaction or as a self-limiting surface reaction because it ceases once all the reactive sites on the surface have been consumed by the excited neutrals.

Obviously when we refer to the reaction with the substrate, we are referring to the upper or top surface of the wafer/substrate and not its bottom surface which rests unexposed on the working surface of platen heater 142. It should be noted that unlike traditional art where only one reactant is present in the ALD volume at a time, the excited neutrals of gas A in the present design are always present in the ALD volume. This is because of the continuous production of the plasma from the continuous supply of gas A or plasma gas as explained above.

Again, without being limited to a particular theory, the first self-limiting reaction is followed by a second self-limiting reaction. The second self-limiting (and surface-limited) reaction is between gas B and substrate surface 140 after its first self-limiting reaction above. The end-result of these self-limiting/surface-limited/surface-limiting reactions, also conveniently referred to as simply the self-limiting ALD reaction or the self-limiting reaction (in the singular), is an atomically sized film formed on the surface of substrate 140.

Additionally, there is no deposition on the walls of ALD volume, specifically lower portion 120. That is because their temperature is kept sufficiently below the temperature of substrate 140 to form the film by the above self-limiting reaction. Recall, that the walls of lower portion 120 are heated by cartridge heater(s) to avoid any condensation of reactant gases. Using the above described design, the instant technology is able to achieve films that are remarkably pure and have uniform thickness, while avoiding damage to the substrate surface from high energy plasma ions and electrons (plasma flux).

As already explained, the plasma in the instant design is rapidly terminated, quenched, shorted or "killed" over the short distance/length below quartz plate 104E at metal plate 122A (see FIG. 6). In yet another aspect, the present design is unlike a typical chemical vapor deposition (CVD) system or other traditional ALD system designs which are dependent on the "flow" of reactants in the chamber. Without being limited by a specific theory, the instant ALD techniques utilize activated neutrals for its self-limiting or surface-limited reaction without requiring uniformity in gas distribution in the ALD volume.

As a result, the present design of metal plate 122A (and corresponding ceramic plate 123A) requires much fewer holes 122B (and 123B) than attributable to a typical dense holes showerhead design of the prevailing art. In a typical implementation, the instant design would require only 20-30 such holes in its metal plate as compared to hundred or more holes of a typical showerhead design. Once the monolayer of an atomically sized film is formed utilizing sufficient number of activated species/neutrals, the remainder of the activated neutrals do not react and are then pumped out.

Again, without being limited by a specific theory, the plasma, and more specifically the plasma field, is quickly shorted/terminated/quenched by grounded metal plate 122A, with minimal sputtering around metal holes 122B. Preferably, metal plate 122A is made out of aluminum because of its high conductivity in terminating the plasma as well as high thermal conductivity to be at a temperature equilibrium with the rest of chamber 100. In other embodiments, stainless steel or copper may also be employed. If plate 122A is made of stainless steel it will have better sputtering qualities than aluminum, however one would need to contend with its less efficient electrical and thermal conductivity than aluminum. If a copper plate is employed, it would have superior thermal/electrical conductivity but one would have to be careful about copper impurities reaching the substrate.

As will be apparent by now, small holes 123B of ceramic plate 123A only allow the activated neutrals of gas A to pass through. They accomplish this while also completely or almost completely or substantially preventing the flow of plasma flux containing energetic ions and electrons to substrate 140. The present technology is able to do this because holes 123B of ceramic plate 123A are specifically designed to have diameter less than two Debye lengths of the plasma. Those skilled in the art will understand that Debye length A of a plasma is estimated by:

$$\lambda \simeq \sqrt{\frac{\varepsilon_0 kT}{e^2 n}},$$ Eq (1)

where $\varepsilon_0$ is the permittivity of free space, k is the Boltzmann constant, e is the charge of an electron while T and n are the temperature and density of the plasma electrons respectively. Substituting the values of constants $\varepsilon_0$, k and e while ensuring the consistency of units in Eq. 1 yields:

$$\lambda \simeq \sqrt{\frac{kT \text{ in eV}}{n \text{ in cm}^{-3}}} \, 743 \text{ cm}. \qquad \text{Eq (2)}$$

For a typical ALD recipe supported by the instant techniques, the plasma is powered at 200 Watts resulting in temperature T of around 2 eV with density n of about $10^8$ per $cm^3$. Plugging these values in Eq. 2 results in:

$$\lambda = \sqrt{2/10^8} \, 743 \text{ cm} \approx 0.105 \text{ cm} \approx 1 \text{ mm} \qquad \text{Eq (3)}.$$

Indeed, in the instant design the diameter of holes 123B of ceramic plate 123A is kept at 1 mm (or 0.038 inches) which is obviously less than $2\times\lambda$ or $2\times1.05=2.1$ mm. The thickness of ceramic plate 122A itself is about 6.35 mm (or 0.25 inches). This results in a large aspect ratio (thickness/diameter) of about $0.25/0.038 \approx 6.58$.

Let us consider the scenario that electron density n in the chamber were much higher than that used in Eq. 3, leading to a value of $\lambda$ much lower than 1 mm. Without being limited by a specific theory, the value of n would drop from the mouth of holes 123B at the surface of ceramic plate 123A, towards the interior/deeper portion of holes 123B. This is evident because the plasma neutrals will travel through holes 123B from the upper surface of ceramic plate 123A towards its lower surface, approaching substrate 140.

Because of the high aspect ratio of the ceramic plate of the instant design, at some point during this travel of the neutrals, the value of n will drop sufficiently enough to achieve a value of $\lambda$ close to that computed in Eq. 3. Henceforth, the instant design is still able to achieve its benefits by ensuring that the diameter of ceramic plate holes 123B is kept less than $2\times\lambda$. Obviously, if the value of electron density n were any lower than that used in Eq. 3, that would only increase the value of $\lambda$ than that computed in Eq. 3.

As a direct consequence of the above design, there is an isolation/separation between the plasma and the ALD volumes. This isolation/separation is accorded by metal and ceramic plates 122A and 123A respectively. Because of the smaller number of holes 122A and 123A than traditional designs such as a grid, and the extremely small size of holes 123B, the plasma volume and the ALD volume can be kept at different desirable pressures.

The instant design allows one to maintain higher pressure in the plasma volume than in the ALD volume. This consequently prevents precursor gas from diffusing to the plasma volume and depositing there. Therefore, in the present design, quartz plate 104E does not accumulate deposits. In the preferred embodiment, the pressure in the ALD volume in lower portion 120 is kept at 0.27 Torr or lower, while the pressure in the plasma volume/chamber is kept higher at 0.5 Torr. Moreover, the plasma can thus be struck at a higher pressure where it is easier to control/maintain and is more readily reproducible.

As compared to traditional art, gas A flows continuously into chamber 100, and is always present around substrate 140 in an excited state. This is indeed a surprising aspect of the instant technology because by definition, traditional ALD techniques involve sending alternating pulses of the reactants, but never the two reactants together. In comparison, a cycle of the instant technology only involves sending one pulse of the precursor gas B in the continuous presence of activated gas A neutrals.

The design all the same still achieves the desired self-limiting ALD reaction. Then after steady-state/background pressure is achieved and any excess precursor and/or byproducts are removed, another pulse of gas B can be sent to repeat the cycle. As many cycles can be repeated as required to achieve a desired thickness of the film. The above results in a dramatic reduction of cycle-time of the instant technology to typically half of that of traditional art. This is illustrated in FIG. 7 showing a timing diagram of the two gases/reactants A and B introduced in chamber 100.

Figure 1:
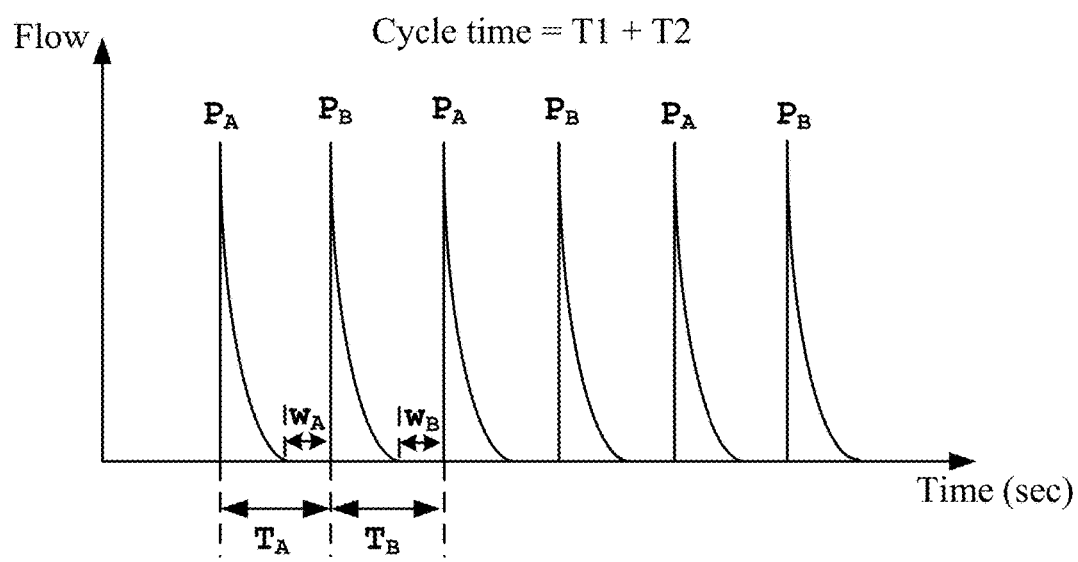
FIG. 1 illustrates a timing diagram of a typical ALD system of the prior art with cycle-time equal to the sum of durations $T_A$ and $T_B$ corresponding to two reactant pulses PA and PB respectively.
Figure 7:
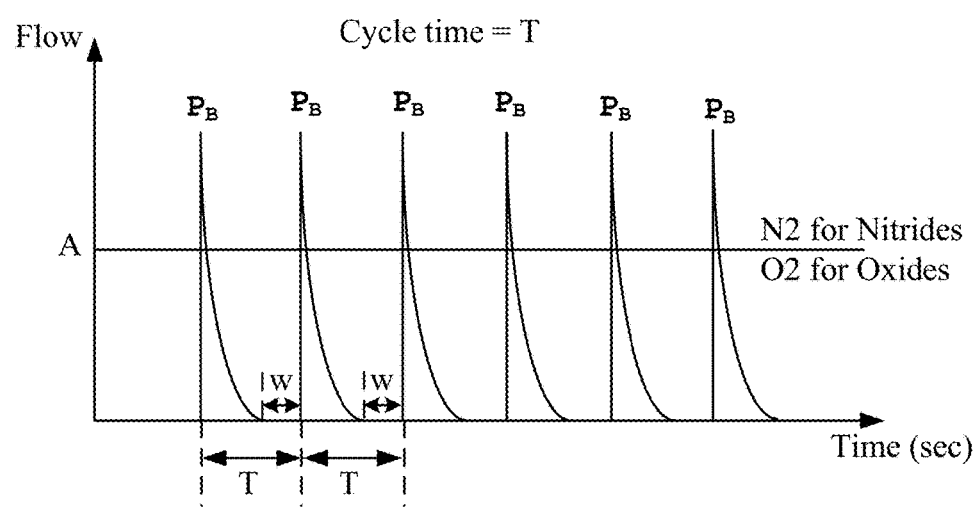
FIG. 7 illustrates the timing diagram of the present ALD design as compared to the timing diagram of prior art of FIG. 1, with cycle-time equal to duration T corresponding to one reactant/precursor pulse PB.

Analogous to the prior art timing diagram shown in FIG. 1, each pulse PB of reactant/gas B in FIG. 7 corresponds to a duration of time T that consists of a dosing time and an additional wait time w as shown. As plasma gas(es) or gas/reactant A with a background or operational pressure are still flowing, during this time w, pulse PB decays to the background pressure. Wait time w may also thus be considered as the purge time because during this time, any excess gas/reactant B and/or reaction products may be pump out or purged from the ALD volume. An advantage of a background or steady-state or operational pressure established by gas A independently of reactant/precursor gas B is that it allows for a constant loading of turbomolecular pump 192 (see FIG. 6). This in turn allows for a consequent stable pressure for plasma discharge.

Note that while in FIG. 1, cycle-time is the sum of the time periods $T_A$ and $T_B$ corresponding to pulses PA and PB of the two gases/reactants A and B respectively. In contrast, for the instant technology, as shown in FIG. 7, the cycle-time is equal only to the time period T corresponding to pulse PB of the precursor or gas B while reactant A is continuously present as shown by the horizontal line A. Moreover, since gas A is always present around substrate 140, no traditional purge cycle or dose-purge-dose-purge sequence is required in the instant design. Specifically, the instant design only requires cycle-time of T consisting of a single dose-purge sequence. Note that for specific recipes, it may be possible to reduce instant wait time w very significantly, approaching zero. To be complete, the dosing time in FIG. 7 for the instant design is obviously T-w.

The compact design of the instant technology with the exceptional results of film uniformity across the substrate surface, and dramatically reduced cycle-times, make it especially useful for a variety of applications. These applications especially include those that require high quality films at a high throughput. The technology is able to produce films of a variety of materials. The results from a non-exhaustive list of films of various materials deposited or coated using the instant continuous-flow plasma enhanced ALD (PEALD) techniques are summarized below. The results indicate the high degree of uniformity of the film across a 6 inch diameter substrate. We refer to a film of such a high degree of uniformity as a substantially uniform film.

1. Gallium nitride (GaN)
   Precursor=GaCl3
   Plasma N2 in standard cubic centimeters per minute (sccm)=20
   Carrier N2 (sccm)=20
   Substrate temperature (° C.)=400
   Plasma RF power (Watts)=150
   Precursor pulse time (ms)=60
   Cycle-time (sec)=10
   # of Cycles=150
   Pressure in ALD volume (Torr)=0.09
   Film thickness=244 Å (approximately 1.6 Å/cycle)
   Thickness change across the surface=+/−0.3%

2. Aluminum nitride (AlN)
   Precursor=TriMethylAlumium (TMA)
   Plasma N2+H2
      Plasma N2 (sccm)=50
      Plasma H2 (sccm)=30
   Carrier Ar (sccm)=50
   Substrate temperature (° C.)=200
   Plasma RF power (Watts)=200
   Precursor pulse time (ms)=20
   Cycle-time (sec)=5
   # of Cycles=200
   Pressure in ALD volume (Torr)=0.27
   Film thickness=220 Å (approximately 1.1 Å/cycle)
3. Aluminum oxide (Al2O3)
   Precursor=TMA
   Plasma O2+Ar
      Plasma O2 (sccm)=75
      Plasma Ar (sccm)=5
   Carrier Ar (sccm)=50
   Substrate temperature (° C.)=200
   Plasma RF power (Watts)=200
   Precursor pulse time (ms)=60
   Cycle-time (sec)=10
   # of Cycles=200
   Pressure in ALD volume (Torr)=0.27
   Film thickness=530 Å (approximately 2.65 Å/cycle)
   Thickness change across the surface=<1%
4. Gallium oxide (Ga2O3)
   Precursor=Triethylgallium (TEGa)
   Plasma O2+H2 (sccm)
      Plasma O2=10
      Plasma H2=10
   Carrier Ar (sccm)=20
   Substrate temperature (° C.)=250
   Plasma RF power (Watts)=150
   Precursor pulse time (ms)=60
   Cycle-time (sec)=5
   # of Cycles=100
   Pressure in ALD volume (Torr)=0.27
   Film thickness=91 Å (approximately 0.91 Å/cycle)
   Thickness change across the surface=<1%
5. Gallium oxide (Ga2O3)
   Precursor=Triethylgallium (TEGa)
   Plasma O2=10
   Carrier Ar (sccm)=20
   Substrate temperature (° C.)=250
   Plasma RF power (Watts)=150
   Precursor pulse time (ms)=60
   Cycle-time (sec)=5
   # of Cycles=150
   Pressure in ALD volume (Torr)=0.19
   Film thickness=180 Å (approximately 1.2 Å/cycle)
   Thickness change across the surface=<1%

Note that in the above results, sometimes a single type of gas or chemical specie is employed for gas A or the plasma gas, while at other times multiple types of gases or chemical species are employed. Specifically, in recipes (1) and (5), GaN and Ga2O3 are produced using an N2 plasma and an O2 plasma respectively. However, in recipes (2), (3) and (4), AlN, Al2O3 and Ga2O3 are produced using plasmas obtained from gaseous mixtures of N2+H2, O2+Ar, and O2+H2 respectively. There are a number of reasons/scenarios as to why multiple species of gas may be used to produce plasma in a given recipe. These include:

1. For stabilizing the plasma. This is the case in recipe (3) above. In recipe (3), Ar at a low partial pressure is used to stabilize the O2 plasma because O2 plasma is often difficult to control otherwise.

2. Removing extra reaction byproducts such as carbon C. This is the case in recipes (2), (3) and (4). This is because many popular precursors of Al (for example, TMA) and Ga (for example, TEGa) known in the art are carbon compounds. These compounds produce extra/free carbon C as a byproduct of the self-limiting ALD reaction. Therefore, in recipes (2) and (4), the excited neutrals of H2 react with the extra carbon C to produce gaseous compounds such as CH4 that can be easily removed from chamber 100. In recipe (3), the excited neutrals of O2 react with the extra carbon C to produce CO2 which is then pumped away to remove carbon from the process. In the absence of excited H2 and O2, the extra carbon C would deposit as a solid on substrate 140, deteriorating the film thickness/quality and with the added difficulty of removing the solid byproduct from the chamber.

3. For any necessary loading of turbomolecular pump 192 (see FIG. 6). Sometimes a non-reactive gas may be added to gas A to ensure that pump 192 has sufficient loading to operate properly. More specifically, sometimes a recipe calls for keeping the pressure of a gas in plasma volume to such a low pressure that pump 192 would not operate effectively. In such a scenario, an inert gas with sufficient partial pressure may be added such that the total pressure of the gas mixture causes proper loading of the turbo molecular pump 192.

It should be noted that in addition to gas A, another gas may also be added to gas B. Recall that gas B is typically a metal precursor on a carrier gas. For example, an inert gas may also be added with the carrier gas of the precursor to remove unwanted byproducts of the reaction as in scenario (2) above. Similarly, an inert gas may also be mixed with the carrier gas of the precursor to provide sufficient loading for turbo pump 192 as in scenario (3) above. In addition to the above films, the instant techniques may be used to deposit many other different types of films. The various types of films deposited/coated by the instant technology include AlN, Al2O3, GaN, Ga2O3, SiO2, Si3N4, ZnO, Zn3N2, HfO2, etc.

Before moving on, the reader should note that while there is no limit to the number of individual species/types of gases or component gases that may be mixed to form gas A and gas B, care should be taken that the gases in the mixture are not very mutually reactive at the pressures involved. In other words, an O2+H2 mixture for plasma at high pressures will be mutually reactive. Note however that in recipe (4) above, it was still possible to use O2 and H2 but at the low pressures of 10 sccm, while the carrier for the precursor was Ar at 20 sccm.

Figure 8:
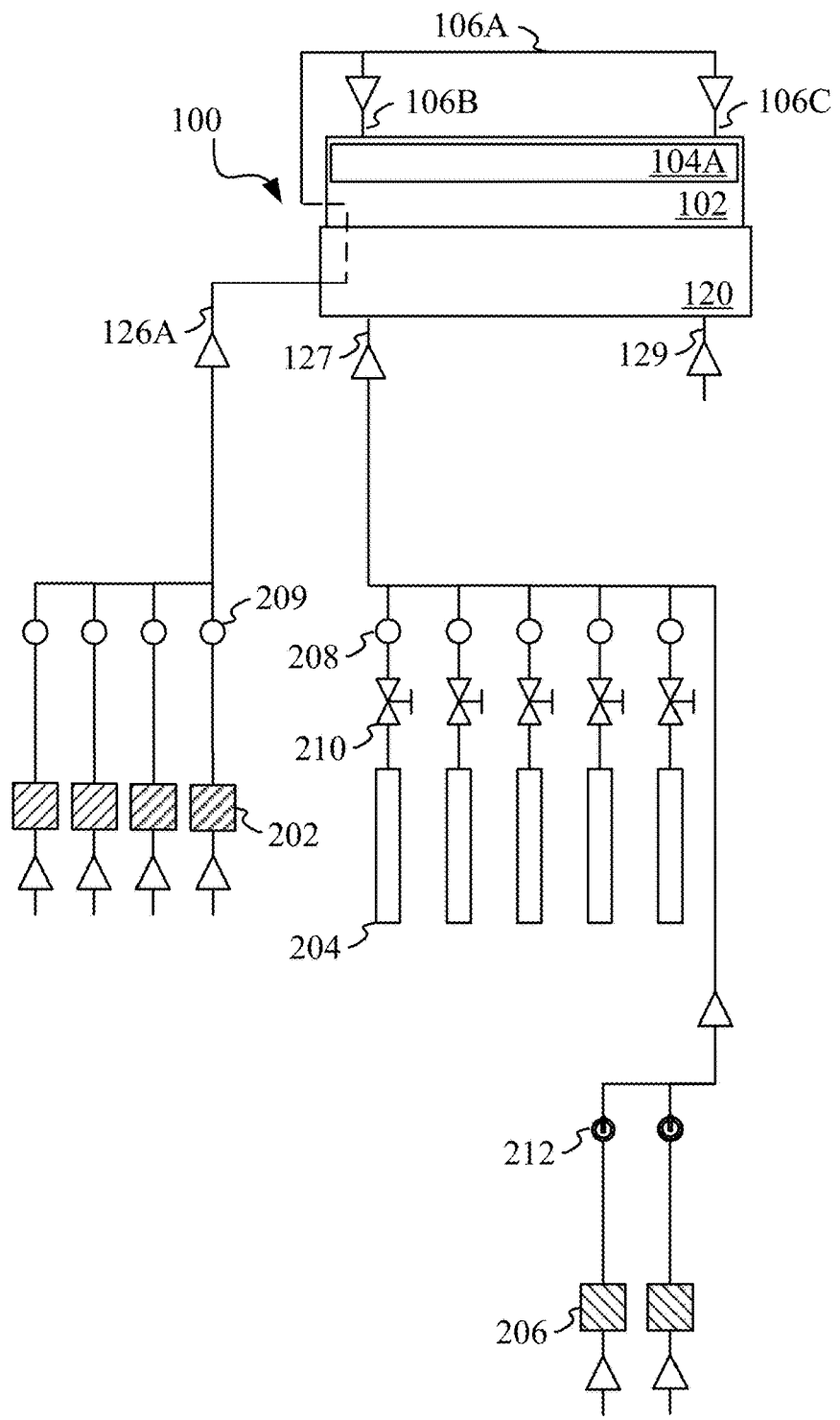
FIG. 8 is a schematic diagram of the gas supply system for the PEALD techniques disclosed in these teachings.

FIG. 8 shows a schematic diagram of a gas supply system according to the instant techniques. Specifically, FIG. 8 schematically shows upper portion 102 and lower portion 120 of chamber 100. FIG. 8 further schematically shows lines 126A to carry gas A and line 127 to carry gas B per earlier discussions to chamber 100. Recall that lines 126A are carried from below chamber 100 and through its walls as shown by the dashed lines in FIG. 8 and then into upper portion 102 via line 106A as shown. To ensure uniformity of the reactant in upper portion 102, specifically in the plasma volume, gas A is supplied at two laterally opposite gas feedthrough points 106B and 106C as shown. Alternatively, there may be a single gas feedthrough or more than two gas feedthroughs. The gas feedthrough(s) may also feed into upper portion 102 at any other appropriate locations(s) such as on the sides of upper portion 102.

Recall from FIG. 3 that lines 126A consist of three individual gas lines that can be used to carry various gas species into chamber 100 (see FIG. 3). These gas species then mix together to come out in line 106A before being delivered into upper portion 102. However, in alternate variations, lines 126A can consist of just a single line, two lines or more than three lines to carry any number of desired gases to upper portion 102 for a given implementation. FIG. 8 shows one practical implementation of the instant technology, and alternate variations not explicitly shown or described are conceivable within the present scope.

Other componentry from earlier drawings is not explicitly shown in FIG. 8 to avoid detraction from the main teachings provided herein. It is also understood that in the schematic of FIG. 8, only one of a multiple of a given type of component may be marked by a reference numeral for clarity. For example, FIG. 8 shows five precursor reservoirs/bottles/bubblers 204 connected to five manual valves 210. Of these only one reservoir 204 and only one manual valve 210 is labeled for clarity. Similarly, only one of five ALD valves 208 is indicated in FIG. 8, and so on.

FIG. 8 also shows four MFC's 202 filled with a hatched pattern going from upper right to lower left, of various gas species as required to produce gas A. For a typically recipe, only one or two of the four reservoirs would supply gas A to chamber 100 as explained above. This is accomplished by manipulating pneumatic valves 209, which are usually controlled programmatically by a control software (not shown). Unlike traditional systems, pneumatic valve(s) 209 of the instant continuous-flow design do not need to be pulsed, and are activated/opened at the start of the process. FIG. 8 also shows the inbound flow to MFC's 202 from below. This inflow is typically fed from high pressure tanks from below (not shown) containing plasma gases, preferably N2, Ar, O2 and H2 per above teachings.

These gases are then carried to plasma source 104A in upper portion 102 of chamber 100 via lines 126A and 106A as explained where they mix together. Then they are delivered as gas mixture A or more simply just gas A or the plasma gas to plasma source 104A. Plasma source 104A generates plasma from gas A whose excited neutrals then pass through holes in metal and ceramic plates (not shown) to partake in a self-limiting reaction for ALD as already taught above.

Gas B typically containing a metal precursor is supplied into chamber 100 by line 127. In the embodiment shown in FIG. 8, reactant input/feeding line 129 is not used and is kept closed. Recall that gas B is pulsed from reservoirs or bottles or bubblers 204 into the ALD volume. This is accomplished via programmatic activation of one or more ALD valves 208 shown in FIG. 8.

The schematic of FIG. 8 also shows five manual valves 210 before ALD valves 208. The manual valves are provided so bottles/bubblers 204 can be conveniently replaced/refilled. In a typical ALD process, only one of the five manual valves 210 is kept open while only one of the five ALD valves 208 is programmatically activated by a control software to introduce the pulse of a precursor into chamber 100. However, in other variations, as in the case of gas A, multiple gas species or component gases may be supplied from reservoirs 204 via valves 208 and 210 to form gas mixture B or more simply just gas B. Gas B is then supplied to chamber 100 via line 127 to partake in the self-limiting ALD reaction as per the requirements of a given recipe.

FIG. 8 further shows MFC's 206 filled with hatched pattern going from upper left to lower right. MFC's 206 are used to control the flow of one or more carrier gases and have corresponding shutoff or on/off valves 212. Per above discussion, a carrier gas is used to carry the typically liquid/solid heated precursor from reservoirs 204 into chamber 100. The schematic of FIG. 8 also shows the inbound flow of the carrier gas to MFC's 206 from below. This inflow is typically fed from respective high pressure tanks of the carrier gas, preferably, N2 or Ar per above discussion. By controlling the various reagents/reactants using valves 208, 209, 210, 212 afforded by the instant design shown in FIG. 8, it is possible to change the composition of gas A and/or gas B during a recipe.

In other words, one or more of valves 209 controlling the flow of the components of gas A from MFC's 202 can be programmatically manipulated in a recipe to alter the composition of the plasma gas to chamber 100 during the recipe. Similarly, one or more of valves 208 controlling the flow of the components of gas B from reservoirs 204 may be programmatically manipulated during a recipe to alter the composition of gas B. This may also be done in conjunction with manipulating one or more of valves 212 of carrier gases from MFC's 206. The above functionality may be desired if compounds of more than one type need to be deposited during the recipe. In this case, a purge cycle to clean chamber 100 may be necessary once an ALD film of a required compound is completed and the next layer of the film of a different compound in the same recipe needs to be deposited.

Figure 9:
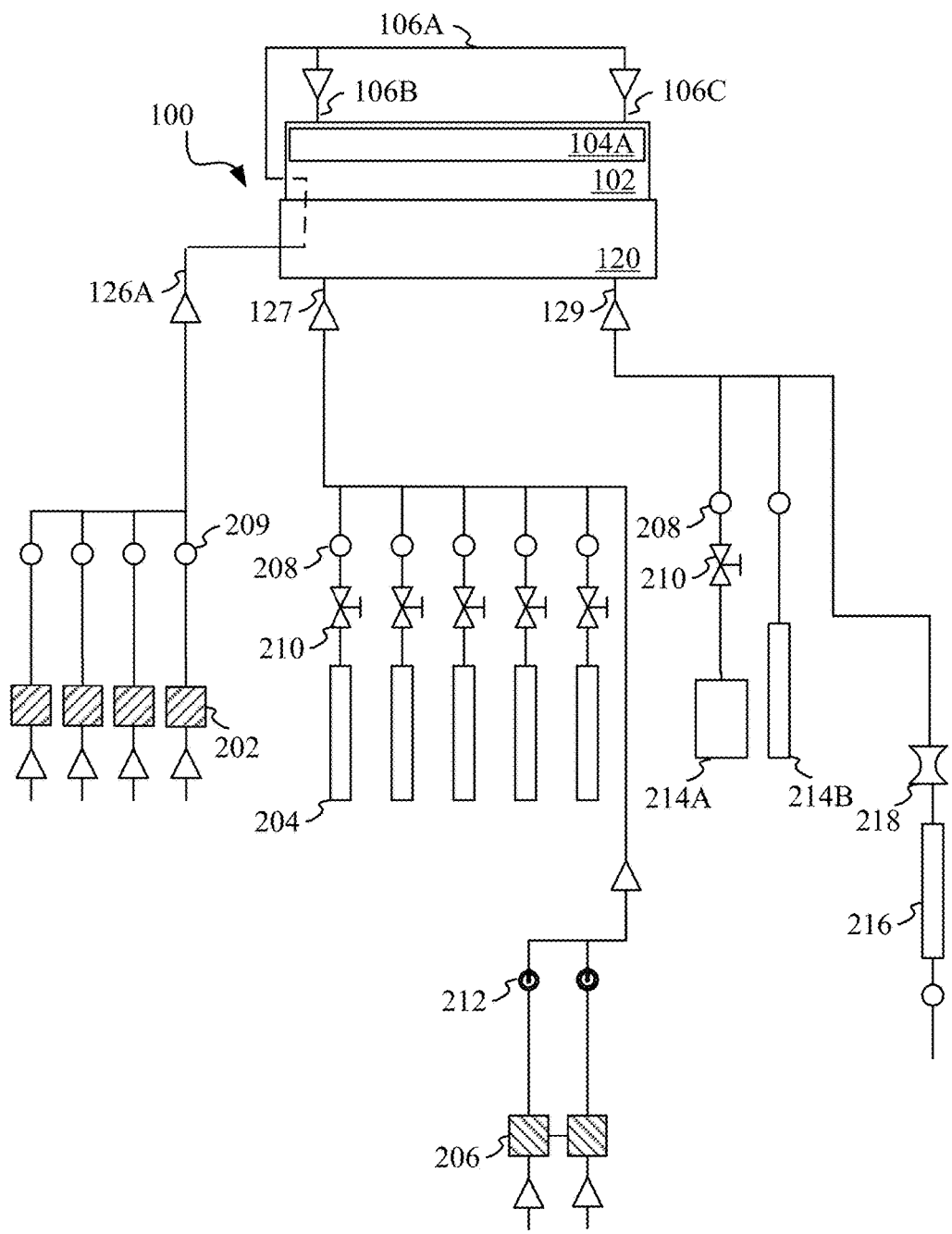
FIG. 9 is a variation of FIG. 8 providing support for thermal ALD.

As already mentioned that FIG. 8 provides one useful implementation while alternative gas supply designs may also be envisioned within the present scope of the disclosed techniques. Indeed, in another useful embodiment, a variation of the schematic of FIG. 8 is used to support thermal ALD processes. This variation is shown in FIG. 9. In FIG. 9, there are two additional reservoirs 214A and 214B for providing continuously flowing reactant for thermal oxidation via line 129 to lower portion 120 of chamber 100. Lines 126A are no longer used because plasma is not used for activation of neutrals. Instead, heat is used to help dissociate the reactant species for their reaction on the heated surface of substrate 140.

In one such thermal ALD variation, heated and externally supplied ozone (O3) from an ozone generator 214A is sent to the ALD volume. As shown, generator 214A is connected to a manual valve 210 for any convenient removal/replacement operation. Alternatively, thermally excited water vapor from reservoir 214B is sent to the ALD volume for thermal oxidation. In still other variations, nitric oxide (NO) supplied from a tank (not shown) may be used as an oxidizer instead of ozone or water vapor. In any case, water vapor, O3 or NO supplies are controlled by ALD valves 208 for programmatic introduction into the ALD volume. Such embodiments may preferably be used to produce oxide films such as Al2O3, Ga2O3, etc.

In yet another thermal ALD variation of the present design, nitride films taught earlier may also be produced. Nitridation is accomplished by flowing ammonia NH3 or hydrazine from reservoir 216 via micrometer valve 218 into the ALD volume of chamber 100 as shown in FIG. 9. This variation may be used to deposit nitride films including AlN and GaN. However, in such a thermal ALD process, the free hydrogen as a product of the reaction may result in hydrogen content in the deposited film. This may cause the film stoichiometry to deteriorate as compared to earlier plasma enhanced ALD embodiments. Moreover, the excess ammonia/hydrazine also needs to be abated through potentially expensive abatement techniques known in the art.

It should be remarked that the above explained thermal ALD embodiments supported by the instant design are not continuous-flow. In other words, both the precursor as well as the oxidizing/nitriding reactants are pulsed alternately in a typical dose-purge-dose-purge sequence. As already explained, that plasma is not used for reactant activation in these thermal embodiments. As such, continuously flowing plasma gas A in lines 126A of earlier PEALD embodiments is not used. The purpose of providing these thermal embodiments is to show that the instant continuous-flow PEALD design is versatile enough to support more traditional thermal ALD processes also.

However, the above thermal ALD embodiments still benefit from the compact design of the smaller ALD volume of the earlier PEALD embodiments. Even though no plasma is used in these embodiments, cycle-time is still reduced, because a smaller chamber volume needs to be purged than traditional thermal ALD systems. Though the present design fully supports thermal ALD as explained above, the plasma enhanced embodiments explained earlier have shown to produce very uniform and high quality films without downstream abatement processes.

Let us now turn our attention to an advantageous post processing step of the present techniques. This step prevents oxidation of the hot substrate sample after film deposition from the above applied techniques. Specifically, the step utilizes a load-lock mechanism with an automatic/robotic arm and an end effector. In conjunction with a lift assembly of platen heater 142 (see FIG. 4), the end effector transfers the substrate after film deposition from the ALD volume to an airtight load-lock compartment. The compartment contains inert N2 in which the substrate is allowed to cool off before being exposed to the atmosphere. Otherwise, if the hot substrate were to be exposed to the atmosphere, it would oxidize/react with the atmospheric oxygen and this oxidation would negatively affect the quality of the deposited film.

Figure 10:
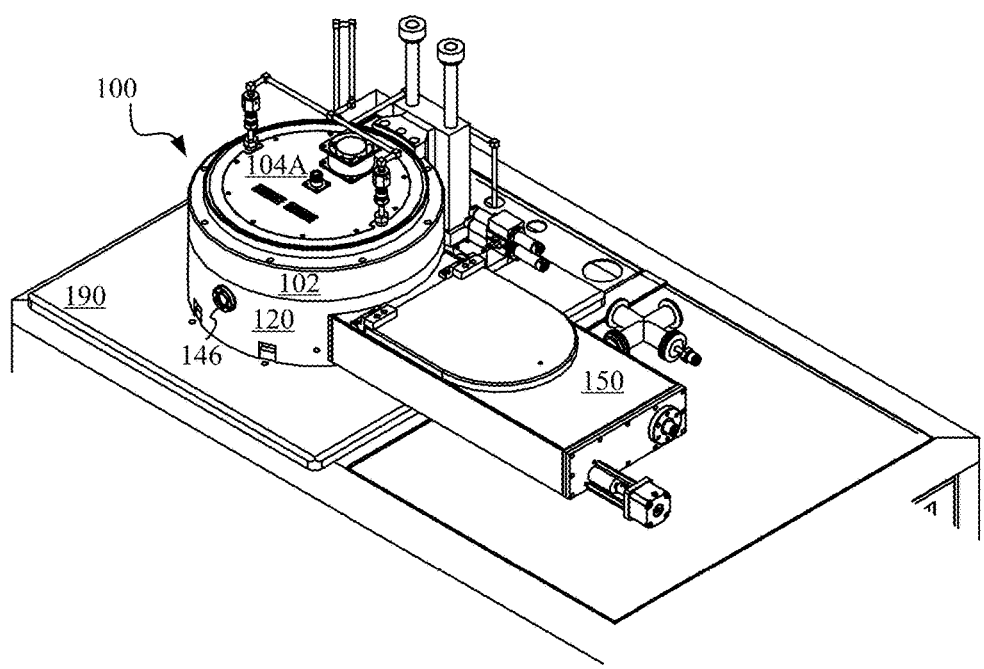
FIG. 10 is an isometric view of a load-lock mechanism/assembly interfaced with the continuous-flow PEALD chamber of the present teachings.

To understand the working of this post processing step in detail, let us look at a right isometric view of the embodiment illustrated in FIG. 10. FIG. 10 shows chamber 100 of the earlier embodiments (see FIG. 2-6) without the reference numerals for all of the components for clarity of illustration. In particular, FIG. 10 shows a load lock mechanism 150 interfaced/connected with lower portion 120 of chamber 100. A robotic arm with an end effector inside load-lock 150 automatically transfers the finished substrate 140 from chamber 100 to its airtight compartment. In that compartment, substrate 140 would cool off to room temperature without being exposed to environmental oxygen.

Figure 11:
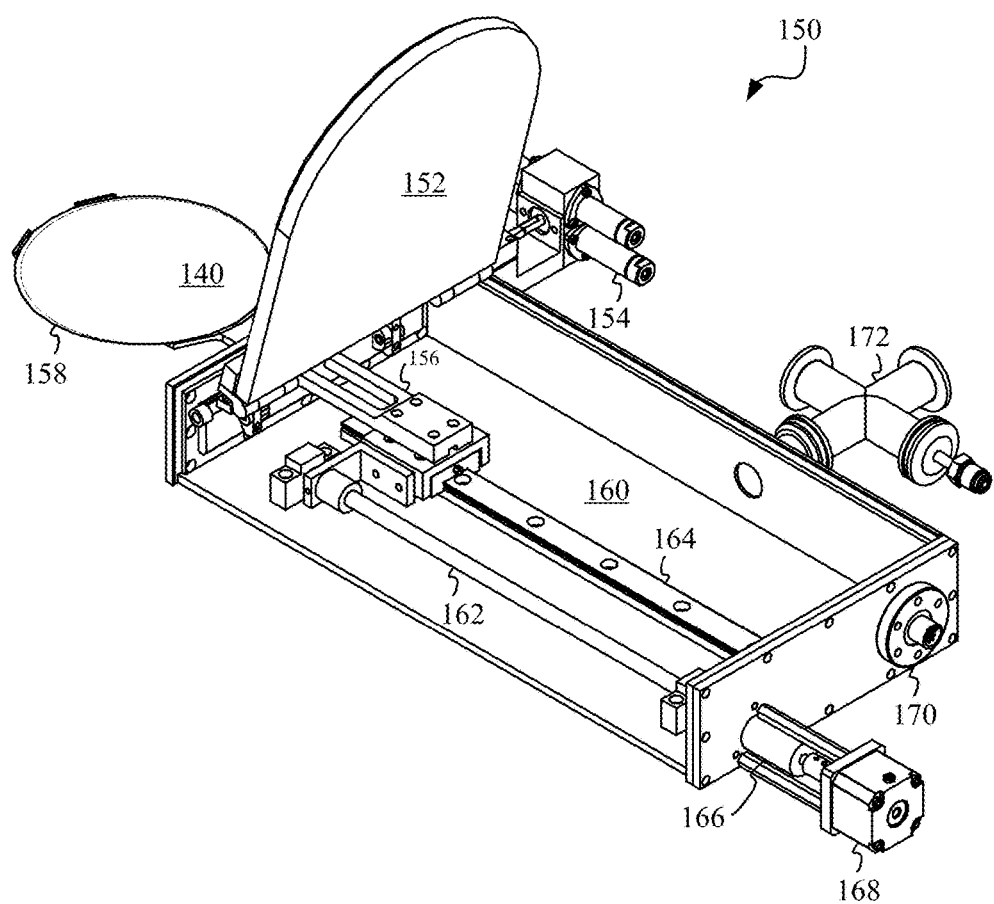
FIG. 11 is a detailed view of the load-lock mechanism/assembly of FIG. 10 showing its internal components.

To visualize this further, let us look at the detailed view of load-lock mechanism or assembly 150 in FIG. 11. FIG. 11 shows a load-lock compartment 160 whose top and front walls have been removed from the figure to delineate the internal components. In addition to compartment 160 there is a flap door 152 preferably made out of polycarbonate thermoplastic or some other suitable material capable of sustaining the operating temperature and pressure conditions of the system. FIG. 11 further shows flap door actuators 154 that are used to programmatically open or close flap door 152 of load-lock compartment 160. Compartment 160 attains a sealed state when flap door 152 is in the closed position.

There is a robotic arm or simply arm 156 with an end effector 158 as shown in FIG. 11. Let us first refer to FIG. 4 to review lift assembly 143A-C of platen heater 142 introduced earlier. Specifically, actuator 143C and actuator mount 143B are first programmatically activated to raise sample lift 143A to the raised position shown in FIG. 4. Lift 143A in turn raises the hot substrate above its top or working surface. Now referring to FIG. 11 again, arm 156 and end effector 158 are used to move underneath substrate 140 raised above platen heater 142 and to prop and carry substrate 140 into compartment 160 of load-lock mechanism/assembly 150.

To linearly manipulate arm 156 and end effector 158 a ballscrew assembly 162 (whose threads are not visible in FIG. 6) is provided. Ballscrew assembly 162 is activated by a vacuum rotational feedthrough 166 driven by a stepper motor 168. Stepper motor 168 in conjunction with rotational feedthrough 166 and ballscrew assembly 162 are used to programmatically drive arm 156 with end effector 158 along guide rail 164 in and out of compartment 160.

During normal operational flap door 152 is kept in a closed position and vacuum conditions are achieved in compartment 160 by a load-lock vacuum pump (not shown) connected via connections 172. Connections 172 are then used to fill load-lock compartment 160 with N2. Connections 172 include connections/pipes for pumping, venting, filling and feedthrough gauge connections for load-lock mechanism 150. Once ALD process is finished in chamber 100, substrate 140 is then brought into the airtight inert N2 environment of compartment 160 per above explanation. It remains there with flap door 152 closed until it cools off to room temperature. This minimizes any oxidation and deterioration of its surface.

Figure 12:
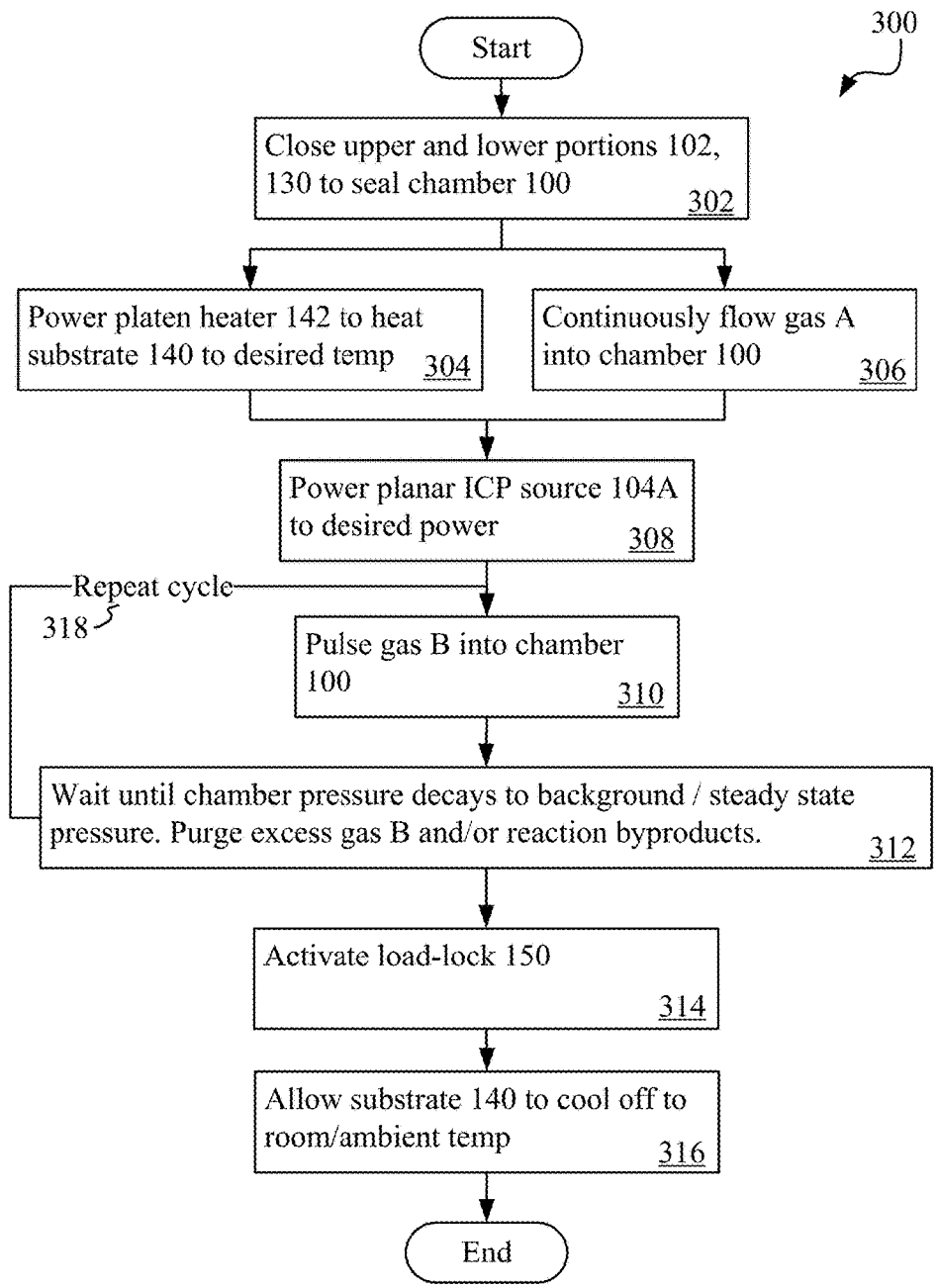
FIG. 12 shows in a flowchart form the steps required to carry out an exemplary embodiment of the continuous-flow plasma enhanced ALD (PEALD) techniques presently disclosed.

FIG. 12 shows in a flowchart form the steps required to carry out an exemplary embodiment of the continuous-flow plasma enhanced ALD (PEALD) techniques described herein. In conjunction with FIGS. 2-11 and associated explanations, flowchart 300 of FIG. 12 depicts that the process starts by sealing chamber 100, and specifically closing its upper portion 102 and lower portion 120. This step is shown by process box 302. Then next step 304 is carried out by heating substrate 140 by powering platen heater 142. In parallel, gas A or the plasma gas is continuously flowed into chamber 100 per above explanation as indicated by box 306.

Next, planar ICP source 104A is powered as shown by box 308. More specifically, in step 308 electrical power to the power supply of ICP source 104A is turned on and appropriate power setting is selected to produce RF signal of the desired strength. This RF signal is carried to ICP source 104A, specifically its RF antenna/coil 104B via RF input port 104C. In one embodiment, the antenna/coil can be powered at up to 1000 watts.

Next, gas B is pulsed into chamber 100, as indicated by box 310. This step is accomplished by utilizing fast ALD valves 208 (see FIG. 8-9) with actuation times preferably less than 100 milliseconds. As a result, excited neutrals of gas A, the pulse of gas B and heated substrate 140 react in a self-limiting manner taught above to produce an atomically sized film on substrate 140. One cycle of the process constitutes sending the pulse and waiting enough time for the pulse to decay to the background or steady-state pressure of the chamber per above explanation.

As already explained, any excess precursor or gas B as well as any reaction byproducts may also be purged during this wait/purge time indicated by process box 312 in FIG. 12. The cycle-time is equal to the duration of sending the pulse (dosing) and the wait time w (also see FIG. 7 and associated explanation). Alternatively stated, the cycle-time is equal to the time between the initiation of the pulse and the end of wait time w (which coincides with the initiation of the next pulse). Still differently put, the cycle-time is equal to the time between the initiation of each pulse. The cycle is repeated as many times as needed to obtain a desired thickness of the film on the surface of substrate 140 as shown by the Repeat loop 318.

Once film deposition is complete, load-lock mechanism 150 is activated to bring sample/substrate 140 from chamber 100 into the inert conditions of compartment 160 as depicted by process box 314. Finished substrate 140 then cools off in compartment 160 of load-lock 150 to the ambient room temperature as indicated by box 316. Note that in alternative embodiments, the order of the above steps may be varied while adhering to the principles taught herein. For example, steps 304, 306, 308, 310 may all be carried out in parallel. In such a scenario, the self-limiting ALD reaction will only properly occur once substrate 140 is at its desired temperature and the plasma with the desired strength has been generated according to the recipe. Similarly, one can conceivably perform step 302 in parallel with steps 304 and 306. Other variations of the order of the steps may also be conceived within the present scope.

Figure 13:
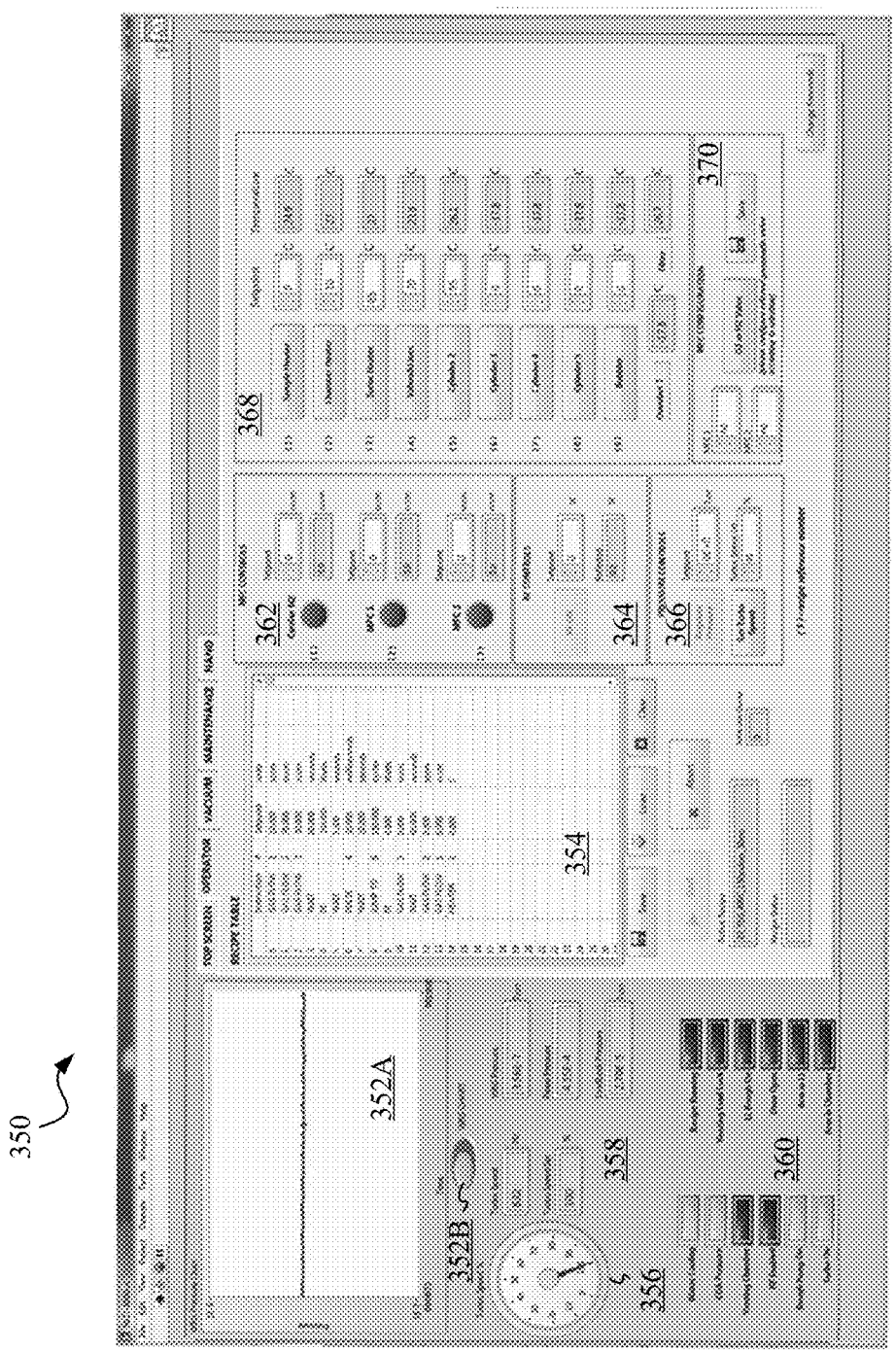
FIG. 13 shows a screenshot from the control software used to control/manipulate the instant ALD system design for executing a recipe.

FIG. 13 shows a screenshot from the control software introduced above that is used to control/manipulate the instant ALD system design for executing a recipe. Specifically, screenshot 350 of FIG. 13 shows a pressure chart 352A indicating pressure versus time. The pressure readout can be selected from toggle button 352B to either general system pressure measured by a wide range gauge (WRG), or ALD volume or process chamber pressure measured by a Pirani gauge. There are several choices of instruments available from vendors for these gauges to the skilled artisans. These include WRG-D gauge from Edwards for the WRG gauge above, APGX series linear convection gauge from Edwards for the Pirani gauge above. Additionally, load-lock pressure is monitored by a micro-Pirani gauge such as HPS Series 925 MicroPirani gauge from MKS Instruments.

Screenshot 150 of FIG. 13 further shows a recipe table 354 where the user can write a set of instructions to be executed for the recipe. The instruction set can be saved, edited, loaded, etc. In addition to programmatic controls of ALD valves (see FIG. 8-9), every manual control is also available as a recipe instruction. The instructions include the following:
1. Pulse—for opening ALD valve for the specified pulse duration.
2. Wait—for waiting specified number of seconds before executing the next instruction.
3. Jump To—for jumping to a specified instruction and repeating/looping a specified number of times. This capability is crucial for repeating cycles in order to obtain film of required thickness (also see FIGS. 2-6 and FIG. 12 and the associated explanation).
4. Heater—for changing the temperature setpoint for the selected heater. A setpoint is an operator defined value and the heater would continue heating until this setpoint is achieved and then maintain the setpoint temperature thereafter.
5. Thermalize—for waiting until the temperature setpoint for the selected heater above is reached.
6. Gas Flow—for controlling the flow of gases for the selected MFC's (see also FIGS. 8-9 and associated explanation).
7. Angle Valve—for opening or closing pump valves for longer precursor dwell/residence times in high aspect ratio (HAR) deposition applications. Note that for HAR applications turbo 192 can be slowed down to increase the dwell/residence times of the precursor.
8. RF—for delivering selected RF power to ICP source 104A.
9. Turbo—for turning on or off turbomolecular pump 192 (see FIG. 6 and associated explanation).
10. Regulate pressure—for automatically maintaining the selected pressure at the specified pressure setpoint.

Screenshot 350 of the control software of the present design further shows gauge 356 indicating the speed of the turbo pump as a percentage of its maximum speed. It also shows gauges 358 that include turbo speed in Hertz and a turbo setpoint indicator, as well as readouts from WRG and Pirani pressure gauges per above explanation. In the lower region of the screen indicated by reference numeral 360 are status bars of various components and sub-systems, including cooling subsystem, compressed dry air (CDA), venting status of the chamber, RF status, etc.

Further shown are MFC controls 362 showing which gases are being flowed at what pressure, RF controls 364 and pressure controls 366. Also shown are various temperature setpoints and corresponding readings 368. These include the temperature setpoints and current temperature readings for platen sample heater 142 (see FIG. 4 and FIG. 6), chamber 100, turbo pump 192, reservoirs/cylinders 202, 204, 206 (see FIG. 8) and 214A-B and 216 (see FIG. 9), and valves/lines, etc. as shown. Finally, screenshot 350 also shows an MFC configuration menu 370 where the user can specify which gases are actually (physically) connected to which MFC's in the system.

Figure 14:
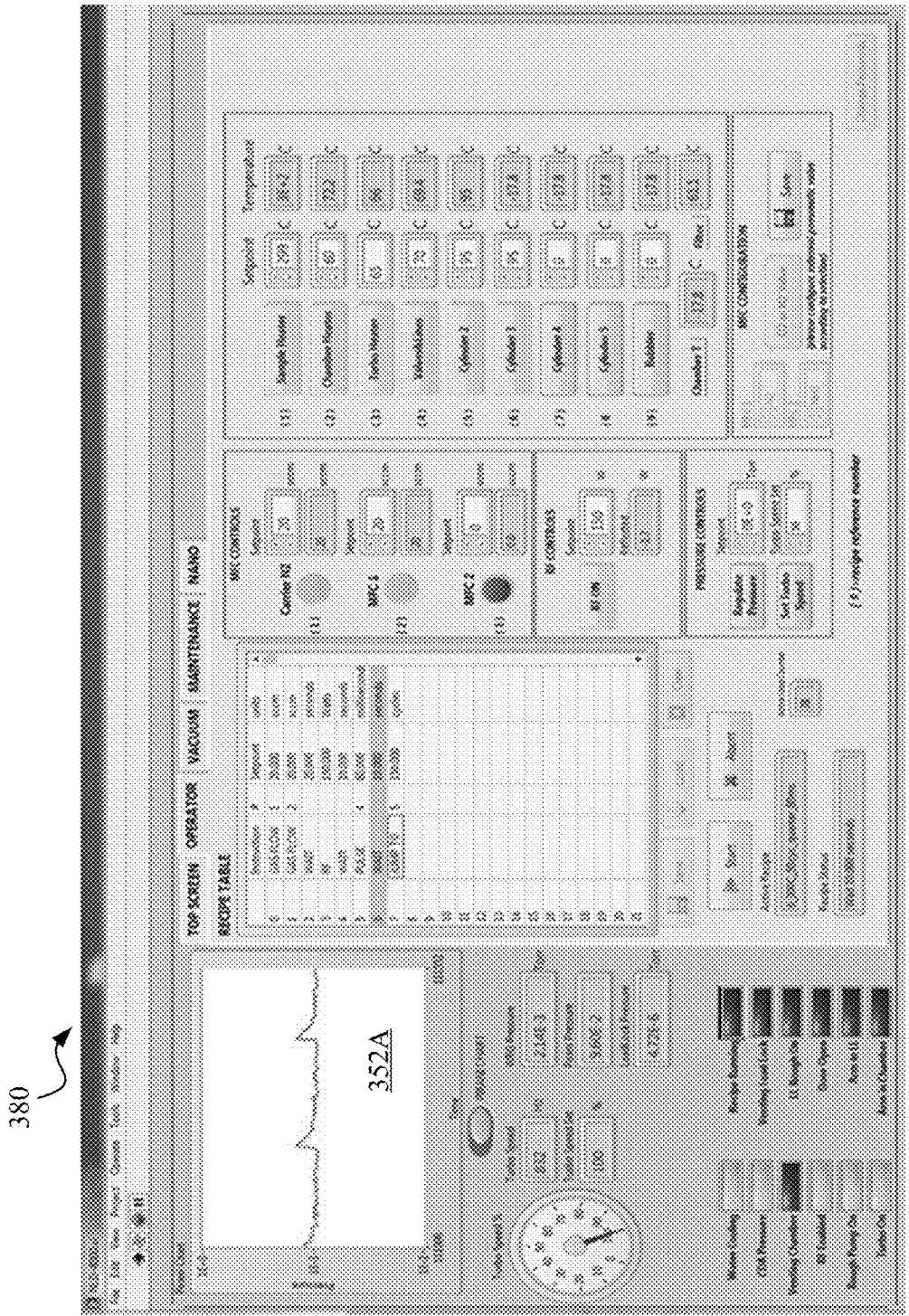
FIG. 14 shows a screenshot of the control software of the instant design from an actual recipe depositing a GaN film using GaCl3 as the precursor.

For completeness, FIG. 14 shows screenshot 380 of the control software of the instant design from an actual recipe depositing a GaN film using GaCl3 as the precursor. While most of reference labels from FIG. 13 are omitted in FIG. 14 to avoid repetition, the reader is encouraged to notice the pulse train of precursor GaCl3 as shown in pressure chart section 352A of screenshot 380. The reader will notice that after the spike or dosing of each pulse is the wait time w per above explanation indicated by the pressure trail following the spike. During this time w, the pressure decays to background/steady-state levels and any unwanted reactants/products are removed (also see FIGS. 6-7 and associated explanation).

It should again be noted that the structure and configuration of the various embodiments described thus far is by way of example only. Alternative structures and configurations are entirely conceivable within the present scope. In particular, the present design requires the plasma generated by an ICP source to be separated or isolated from the ALD volume by above taught combination of metal and ceramic plates with their corresponding holes. This is to allow excited neutrals from the plasma gas to pass through the plates without allowing the plasma flux to enter the ALD volume and from damaging the substrate. As an added advantage, such a design allows one to maintain a pressure differential between the plasma volume and the ALD volume as taught above.

Therefore, in alternative embodiments, there may not be an upper and lower portion of the chamber, or the chamber may have more than two sections/portions. Similarly, gases may be supplied to the chamber in alternative fashion. This includes feeding gases in from the sides and via any number of appropriate gas feedthroughs. All such variations may be feasible so long as the plasma is kept above the conducting metal plate, and the precursor gas is kept below the ceramic plate in order to maintain the above discussed separation/isolation. More specifically, the separation/isolation objective is achieved by feeding plasma gas to the ICP source above the conducting metal plate, and by feeding the precursor gas to the chamber below the ceramic plate. Still other configurations may be conceived by those skilled in the art.

The teachings heretofore have been focused on disclosing the methods and systems for the instant continuous-flow ALD techniques for a single substrate/wafer configuration. This is obvious, because the above embodiments produce a uniform thickness film on a single substrate/wafer 140 (see FIGS. 2-6 and FIGS. 8-14). However, in a batch version of the instant design, selected components of earlier embodiments are utilized to incorporate multiple wafer substrates on which the highly uniform film is deposited simultaneously according to above taught techniques.

Figure 15:
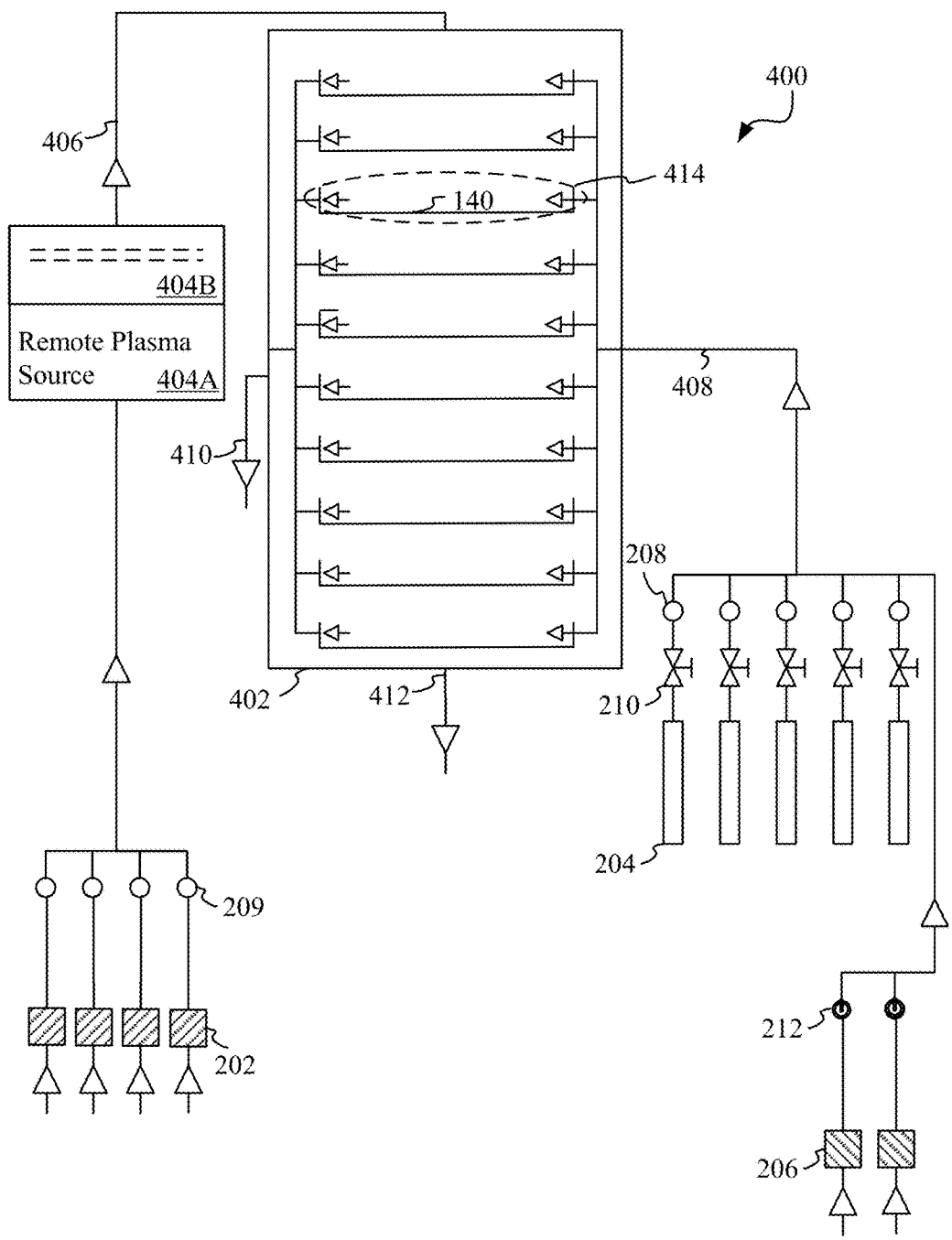
FIG. 15 is a schematic diagram of a batch embodiment for performing continuous-flow PEALD on a batch of wafers according to the instant teachings.

The schematic illustration of such an embodiment 400 is provided in FIG. 15. The reader will notice that FIG. 15 incorporates many components from the earlier single-wafer schematics of FIG. 8-9. However, in batch PEALD embodiment 400, the plasma is generated by a remote plasma source 404A. The plasma gases are supplied to remote plasma source 404A as in earlier single-wafer embodiment, from MFC's 202 and valves 209. Preferably, plasma source 404A is an inductive plasma source. Moreover, plasma source 404A may or may not be a planar plasma source. This is because its form factor no longer needs to conform to chamber 100 of the earlier described single-wafer designs. At or new plasma source 404A are grounded metal plate and ceramic plate of the earlier embodiments as shown by dashed lines in plasma filter module 404B.

As per above teachings, the plasma is terminated by the grounded metal plate in filter module 404B and then filtered through the small holes of the ceramic plate in filter module 404B. Activated neutrals of the plasma are then carried from plasma filter module 404B via normal stainless steel tubing 406 to a batch chamber 402 as shown. According to this aspect of the technology, the activated neutrals will stay excited for a reasonable tubing distance 406, preferably about half a meter. The plasma is then delivered to batch chamber 402.

Batch chamber 402 comprises several identical substrate modules of which one substrate module is marked by reference label 414. Substrate modules are vertically stacked in batch chamber 402 as shown. Each substrate module 414 comprises a heated wafer 140. In one variation, substrate modules 414 have quartz housing and substrates 140 are heated by Infrared (IR) lamps (not shown). Note that other appropriate wafer heating mechanism(s), resistive or otherwise, such as platen heaters may also be used as will be appreciated by skilled artisans. Such heating mechanisms are omitted from FIG. 15 to avoid detractions from the main teachings of the present embodiments.

As in single-wafer embodiments, precursor bottles 204, valves, 210 and 208, and carrier gases from MFC's 206 and on/off valves 212 are used to supply ALD precursor for the above taught self-limiting reaction in chamber 402. As shown, the precursor is supplied via line 408 directly above substrates 140 in the ALD volumes inside substrate modules 414. There, the plasma activated neutrals come in contact with the precursor delivered by line 408 above heated substrates 140. The resulting self-limiting reactions deposit an atomically sized film on all substrates 140 simultaneously as a product of the reaction in this batch operation. As before, as many ALD cycles may be run and pulses of gas B may be passed in batch chamber 402 in order to obtain ALD films of the desired thickness.

During the ALD cycles, gases from ALD volumes are pumped out via exhaust line 410. Any remaining gases in chamber 402 may be pumped out via exhaust line 412. In this manner, as in the case of single-wafer embodiments, pure and extremely uniform ALD films are simultaneously produced on all substrates 140 in substrate modules 414. Substrates 140 are then preferably allowed to cool off in the clean, inert environment of chamber 402 to lower operating or room/ambient temperature. As in earlier embodiments, this post-processing step is necessary in order to prevent/minimize oxidation of the wafers by environmental oxygen. Note that in this batch embodiment, load-lock mechanism 150 (see FIG. 10-11) from single-wafer embodiments is not used.

However, in a cluster version of the instant technology, each substrate module is a single-wafer processing chamber of the earlier single-wafer embodiments. Each chamber has its own load-lock mechanism and a robotic arm for loading/unloading the wafers. Then a whole cluster of wafers may be coated simultaneously according to the instant techniques. As with the single-wafer embodiments, other configurations supporting deposition/coating of multiple wafers within the present scope may be conceived by those skilled in the art. Such configurations may include batch/cluster variations or still other ways of organizing and coating multiple wafers according to the instant principles.

As already taught above, heating of the substrate can be done by Infrared radiation (IR). This mechanism eliminates/reduces plate contact and results in a more uniform substrate temperature. In other variations, for surface cleaning prior to starting the ALD process, the substrate can be biased with RF. Specifically, plasma can be produced around the wafer/substrate to remove any organic contaminations before commencing the ALD process. This also improves adhesion of the substrate to the plate.

Still other variations of the present technology include double-sided ALD. In other words, the technology may be adapted to coat both sides of the wafer/substrate. As already mentioned, the present technology may also be used to deposit oxides such as hafnium(IV) oxide (HfO2), that are promising for the development of next-generation logic. Additionally, by modifying various components, the present technology may also be used to carry out ALD of graphene.

In view of the above teaching, a person skilled in the art will recognize that the apparatus and methods of invention can be embodied in many different ways in addition to those described without departing from the principles of the invention. Therefore, the scope of the invention should be judged in view of the appended claims and their legal equivalents.

What is claimed is:

1. An atomic layer deposition (ALD) system comprising:
   (a) a cylindrical chamber comprising an upper portion and a lower portion such that said upper portion and said lower portion can be closed to obtain a sealed state of said chamber;
   (b) said upper portion comprising a planar inductively coupled plasma (ICP) source laterally affixed at its distal end from said lower portion;
   (c) said lower portion containing a platen onto which a substrate is placed, said platen and said substrate heated by a platen heater to a desired temperature;
   (d) said substrate isolated from said ICP source in said chamber by a grounded metal plate laterally affixed above said substrate and a ceramic plate laterally affixed below said grounded metal plate but above said substrate, said grounded metal plate and said ceramic plate having a first plurality of holes and a second plurality of holes respectively such that each of said first plurality of holes is aligned with a corresponding hole of said second plurality of holes, and each of said second plurality of holes has a diameter less than two Debye lengths of a plasma, said ICP source configured to generate from a gas A said plasma above said grounded plate and said grounded metal plate configured to terminate said plasma;

(e) said ICP source configured to receive a continuous supply of said gas A;

(f) said lower portion configured to contain a gas B passed as a pulse from below said ceramic plate; and (g) each of said gas A and said gas B comprising one or more individual chemical species;

wherein a uniform atomically sized film is produced on said substrate by a self-limiting reaction of excited neutrals of said gas A, said gas B and said substrate.

2. The system of claim 1, wherein said excited neutrals of said gas A pass through said first plurality of holes and through said second plurality of holes to reach said substrate.

3. The system of claim 1, wherein one of said one or more individual chemical species of said gas B is a carrier gas.

4. The system of claim 3, wherein as a result of more than one of said pulse in said element (f), multiple layers of said uniform atomically sized film are produced on said substrate.

5. The system of claim 4 wherein said multiple layers are composed of a compound selected from the group consisting of a nitride and an oxide.

6. The system of claim 5 further comprising a load-lock mechanism for minimizing oxidation of said substrate after said multiple layers have been produced.

7. The system of claim 6 wherein the length of the plasma volume is approximately one inch and the transit distance is less than one centimeter.

8. The system of claim 5 wherein said nitride is one of aluminum nitride (AlN), gallium nitride (GaN), silicon nitride (Si3N4) and zinc nitride (Zn3N2), and said oxide is one of aluminum oxide (Al2O3), gallium oxide (Ga2O3), silicon oxide (SiO2), zinc oxide (ZnO) and hafnium oxide (HfO2).

* * * * *